ID

US010347209B2

(12) United States Patent
Sasaki et al.

(10) Patent No.: US 10,347,209 B2
(45) Date of Patent: Jul. 9, 2019

(54) SHIFT REGISTER

(71) Applicant: SHARP KABUSHIKI KAISHA, Sakai, Osaka (JP)

(72) Inventors: Yasushi Sasaki, Sakai (JP); Yuhichiroh Murakami, Sakai (JP); Shige Furuta, Sakai (JP); Hidekazu Yamanaka, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 6 days.

(21) Appl. No.: 15/570,296

(22) PCT Filed: Apr. 21, 2016

(86) PCT No.: PCT/JP2016/062604
§ 371 (c)(1),
(2) Date: Oct. 27, 2017

(87) PCT Pub. No.: WO2016/175118
PCT Pub. Date: Nov. 3, 2016

(65) Prior Publication Data
US 2018/0122320 A1 May 3, 2018

(30) Foreign Application Priority Data
Apr. 28, 2015 (JP) ................... 2015-091120

(51) Int. Cl.
G09G 3/36 (2006.01)
G11C 19/28 (2006.01)
G11C 7/20 (2006.01)

(52) U.S. Cl.
CPC ......... G09G 3/3677 (2013.01); G09G 3/3688 (2013.01); G11C 7/20 (2013.01);
(Continued)

(58) Field of Classification Search
CPC ......... G09G 3/3677; G09G 2310/0286; G09G 2310/08; G11C 7/20; G11C 19/28; G11C 19/287
See application file for complete search history.

(56) References Cited

U.S. PATENT DOCUMENTS 8,779,809 B2 * 7/2014 Murakami ....... H03K 19/01714
327/112
8,923,472 B2 * 12/2014 Sasaki .................. G11C 19/184
377/64

(Continued)

FOREIGN PATENT DOCUMENTS

JP 2004-524639 A 8/2004
WO 2009/084267 A1 7/2009
(Continued)

OTHER PUBLICATIONS

Co-pending letter which recites a co-pending application.

Primary Examiner — Patrick O Neill
(74) Attorney, Agent, or Firm — ScienBiziP, P.C.

(57) ABSTRACT

A unit circuit 11 of a shift register is provided with a transistor Tr8 having a drain terminal connected to a node N2, a source terminal to which an off potential is applied, and a gate terminal connected to an output terminal OUT, in order to stabilize a potential of the node N2. The unit circuit 11 is further provided with a transistor Tr9 having a drain terminal connected to the output terminal OUT, a source terminal to which the off potential is applied, and a gate terminal to which an initialization signal INIT is supplied. With this, when performing an initialization, it is possible to control the potential of the node N2 to be a desired level and initialize the shift register certainly, irrespective of a state of the transistor Tr8 before the initialization.

13 Claims, 28 Drawing Sheets

(52) U.S. Cl.
CPC ..... *G11C 19/28* (2013.01); *G09G 2310/0286* (2013.01); *G09G 2310/08* (2013.01)

(56) References Cited

U.S. PATENT DOCUMENTS

| | | | |
|---|---|---|---|
| 9,030,237 B2 * | 5/2015 | Hachida | G09G 3/3677 327/108 |
| 2002/0149318 A1 | 10/2002 | Jeon et al. | |
| 2010/0259525 A1 | 10/2010 | Ohkawa et al. | |
| 2013/0155044 A1 | 6/2013 | Ohkawa et al. | |
| 2013/0156148 A1 | 6/2013 | Sasaki et al. | |
| 2016/0018844 A1 | 1/2016 | Sasaki et al. | |
| 2016/0240159 A1 | 8/2016 | Ohkawa et al. | |
| 2016/0253977 A1 | 9/2016 | Ohkawa et al. | |
| 2018/0137831 A1 * | 5/2018 | Murakami | G09G 3/20 |

FOREIGN PATENT DOCUMENTS

| | | |
|---|---|---|
| WO | 2012/029799 A1 | 3/2012 |
| WO | 2012/029876 A1 | 3/2012 |
| WO | 2014/148171 A1 | 9/2014 |
| WO | 2015/012207 A1 | 1/2015 |
| WO | 2015/052999 A1 | 4/2015 |

* cited by examiner

SHIFT REGISTER

TECHNICAL FIELD

The present invention relates to a shift register, and especially to a shift register suitably used for a drive circuit of a display device and the like.

BACKGROUND ART

An active-matrix type display device displays an image by selecting pixel circuits arranged two-dimensionally in unit of row and writing voltages in accordance with image data to the selected pixel circuits. In order to select the pixel circuits in unit of row, a shift register for sequentially shifting an output signal based on a clock signal is used as a scanning line drive circuit. Furthermore, in a display device for performing a dot sequential drive, a similar shift register is provided inside a data line drive circuit.

In a liquid crystal display device or the like, a drive circuit of the pixel circuits may be formed integrally with the pixel circuits using a manufacturing process for forming a TFT (Thin Film Transistor) in the pixel circuit. In this case, in order to reduce a manufacturing cost, it is preferable to form the drive circuit including the shift register with transistors having a same conductive type as the TFT.

Regarding the shift register, various circuits are conventionally known. For example, Patent Document 1 describes a shift register 900 shown in FIG. 27. The shift register 900 has a configuration in which unit circuits 901 shown in FIG. 28 are connected in multi-stage. The shift register 900 performs a normal operation, when an initialization signal INIT and an all-on control signal AON are at a low level and a negative signal AONB of the all-on control signal is at a high level. At this time, transistors Q7, Q9, Q11 turn off and transistors Q8, Q10 turn on.

The normal operation of the unit circuit 901 will be described below. At first, when an input signal IN changes to the high level, a transistor Q3 turns on, a potential of a node N1 becomes the high level, the node N1 becomes a floating state, and a transistor Q1 turns on. Since a clock signal CKA is at the low level at this time, an output signal OUT is at the low level. Furthermore, when the input signal IN changes to the high level, a transistor Q5 turns on, and potentials of nodes N2, N3 become the low level. Next, when the input signal IN becomes the low level, the transistors Q3, Q5 turn off.

Next, when, the clock signal CKA changes to the high level, the output signal OUT becomes the high level. At this time, the potential of the node N1 is pushed up via a capacitor Cv and parasitic capacitance of the transistor Q1, and the potential of the node N1 becomes higher than (VDD+Vth) (Vth is a threshold voltage of the TFT). Thus, a potential of the output signal OUT becomes VDD. Next, when the clock signal CKA changes to the low level, the potential of the node N1 returns to an original high level and the output signal OUT becomes the low level.

Next, when a clock signal CKB changes to the high level, a transistor Q6 turns on, the potentials of the nodes N2, N3 become the high level, and the nodes N2, N3 become the floating state. Thus, transistors Q2, Q4 turn on and the potential of the node N1 becomes the low level. Next, when the clock signal CKB changes to the low level, the transistor Q6 turns off.

After that, the clock signal CKB becomes the high level and the low level in a predetermined cycle. In a high level period of the clock signal CKB, the transistor Q6 turns on and a high level potential is applied to the nodes N2, N3. In a low level period of the clock signal CKB, the transistor Q6 turns off and the nodes N2, N3 keep the high level potential in the floating state.

If the node N2 is in the floating state when the output signal OUT is at the high level, the potential of the node N2 fluctuates due to noise imposed on the output signal OUT, the transistor Q2 may turn on, and the shift register 900 may malfunction. A transistor Q12 has a function of fixing the potential of the node N2 to the low level when the output signal OUT is at the high level. Transistors Q14, Q15 have a function of setting the potential of the node N2 to the high level when both of input signals IN, BIN are at the high level. It is possible to make the shift register 900 more reliable by providing the transistors Q12, Q14, Q15.

The shift register 900 operates in accordance with a timing chart shown in FIG. 29, when a power is turned on. When the initialization signal INIT and the all-on control signal AON change to the high level and the negative signal AONB of the all-on control signal changes to the low level, the transistors Q7, Q9, Q11 turn on and the transistors Q8, Q10 turn off. Thus, the potential of the node N2 becomes the low level and the potential of the node N3 becomes the high level. Accordingly, the transistor Q2 turns off, the transistor Q4 turns on, the potential of the node N1 becomes the low level, and the transistor Q1 turns off. In this manner, since the transistors Q1, Q2 turn off and the transistor Q7 turns on, the output signal OUT becomes the high level and the transistor Q12 turns on. Hereinafter, an operation for setting the output signals of all of the unit circuits to the on level (here, high level) is referred to as all-on output.

Next, when the all-on control signal AON changes to the low level and the negative signal AONB of the all-on control signal changes to the high level, the transistors Q7, Q11 turn off and the transistors Q8, Q10 turn on. At this time, the potential of the node N2 becomes the high level, the transistor Q2 turns on, the output signal OUT becomes the low level, and the transistor Q12 turns off. Hereinafter, an operation for setting the output signals of all of the unit circuits to the off level (here, low level) is referred to as initialization.

The shift register 900 performs the all-on output and the initialization when the power is turned on. Therefore, it is possible to set the potential of the node N1 and the output signal OUT to the low level and set the potentials of the nodes N2, N3 to the nigh level in all of the unit circuits 901, before a start signal ST supplied to the input terminal IN of the unit circuit 901 in a first stage changes to the high level.

PRIOR ART DOCUMENT

Patent Document

[Patent Document 1] WO2012/29876

SUMMARY OF THE INVENTION

Problems to be Solved by the Invention

However, a state of the transistor Q12 is undefined before the initialization, and the transistor Q12 may be in an on state before the initialization. If the initialization signal INIT becomes the high level when the transistors Q10, Q12 are in the on state, a high level potential is applied to the nodes N2, N3 via the transistor Q9 and a low level potential is applied to the nodes N2, N3 via the transistor Q12. Thus, the potentials of the nodes N2, N3 hardly become the high level when performing the initialization. Therefore, the shift register 900 can not perform, the initialization and may malfunction in some cases.

Accordingly, an object of the present invention is to provide a shift register which can stabilize a potential of a node in a unit circuit based on an output signal and perform an initialization certainly.

Means for Solving the Problems

According to a first aspect of the present invention, there is provided a shift register having a configuration in which a plurality of unit circuits are connected in multi-stage, wherein the unit circuit includes: an output transistor having a first conduction terminal connected to a clock terminal configured to input a clock signal, a second conduction terminal connected to an output terminal configured to output the clock signal, and a control terminal connected to a first node; an output reset transistor having a first conduction terminal connected to the output terminal, a second conduction terminal to which an off potential is applied, and a control terminal connected to a second node; and a node control unit configured to control potentials of the first and second nodes, the node control unit includes a node stabilization transistor having a first conduction terminal connected to the second node, a second conduction terminal to which the of f potential is applied, and a control terminal connected to the output terminal, and the unit circuit further includes an output initialization transistor having a first conduction terminal connected to the output terminal, a second conduction terminal to which the off potential is applied, and a control terminal to which an initialization signal that becomes an on level when performing an initialization is supplied.

According to a second aspect of the present invention, in the first aspect of the present invention, the node control unit further includes: a first transistor configured to control the potential of the first node to be the on level in accordance with an input signal of the unit circuit; a second transistor configured to control the potential of the first node to be an off level in accordance with the potential of the second node; a third transistor configured to control the potential of the second node to be the off level in accordance with the input signal; and a fourth transistor configured to control the potential of the second node to be the on level in accordance with a second clock signal of the unit circuit.

According to a third aspect of the present invention, in the second aspect of the present invention, the node control unit further includes a fifth transistor configured to control the potential of the second node to be the on level in accordance with the initialization signal.

According to a fourth aspect of the present invention, in the third aspect of the present invention, the off potential is fixedly applied to the second conduction terminals of the output reset transistor, the node stabilization transistor, and the output initialization transistor.

According to a fifth aspect of the present invention, in the fourth aspect of the present invention, the unit circuit further includes a transistor configured to control a potential of the output terminal to be the on level in accordance with an all-on control signal which becomes the on level when performing an all-on output.

According to a sixth aspect of the present invention, in the fifth aspect of the present invention, the node control unit further includes: a transistor configured to supply an on potential to the first transistor in accordance with a negative signal of the all-on control signal; a transistor having a conduction terminal connected to the second node, a conduction terminal connected to a third node, and a control terminal to which the negative signal of the all-on control signal is supplied; and a transistor configured to control the potential of the second node to be the off level in accordance with the all-on control signal, and a control terminal of the second transistor, a second conduction terminal of the fourth transistor, and a second conduction terminal of the fifth transistor are connected to the third node.

According to a seventh aspect of the present invention, in the fifth aspect of the present invention, the node control unit further includes: a transistor configured to control the potential of the first node to be the off level in accordance with the all-on control signal; and a transistor configured to control the potential of the second node to be the off level in accordance with the all-on control signal, and the first transistor is configured to supply a negative signal of the all-on control signal to the first node in accordance with the input signal.

According to an eighth aspect of the present invention, in the third aspect of the present invention, an all-on control signal which becomes the on level when performing an all-on output is supplied to the second conduction terminals of the output reset transistor, the node stabilization transistor, and the output initialization transistor.

According to a ninth aspect of the present invention, in the second aspect of the present invention, the node control unit further includes a transistor having a conduction terminal connected to the first node, a conduction terminal connected to one conduction terminals of the first and second transistors, and a control terminal to which an on potential is fixedly applied.

According to a tenth aspect of the present invention, in the second aspect of the present invention, one conduction terminals of the first and second transistors are connected to the first node.

According to an eleventh aspect of the present invention, in the first aspect of the present invention, the shift register further includes a plurality of selection circuits configured to select one of an output signal of the unit circuit in a previous stage and an output signal of the unit circuit in a next stage, as an input signal of the unit circuit.

According to a twelfth aspect of the present invention, in the first aspect of the present invention, the unit circuit includes a plurality of the output transistors, a plurality of the output reset transistors, a plurality of the node stabilization transistors, and a plurality of the output initialization transistors.

According to a thirteenth aspect of the present invention, there is provided a display device including: a plurality of scanning lines arranged in parallel to each other; a plurality of data lines arranged in parallel to each other so as to intersect with the scanning lines perpendicularly; a plurality of pixel circuits arranged corresponding to intersections of the scanning lines and the data lines; and a shift register according to any one of the first to twelfth aspects as a scanning line drive circuit configured to drive the scanning lines.

Effects of the Invention

According to the first aspect of the present invention, since the output initialization transistor turns on when performing the initialization, the off potential is applied to the output terminal and the node stabilization transistor turns off. Therefore, when performing the initialization, it is possible to control the potential of the second node to be a desired level and initialize the shift register certainly, irrespective of a state of the node stabilization transistor before the initialization.

According to the second aspect of the present invention, based on the input signal and the second clock signal, a state of the unit circuit can be switched between a state in which the potential of the first node is at the on level and the potential of the second node is at the off level, and an opposite state.

According to the third aspect of the present invention, the potential of the second node can be controlled to be the on level when performing the initialization.

According to the fourth aspect of the present invention, an output signal and the potential of the second node can be controlled to be the off level, using the off potential fixedly applied to the second conduction terminals of the three transistors.

According to the fifth aspect of the present invention, all of the output signals of the shift register can be controlled to be the on level when performing the all-on output.

According to the sixth aspect of the present invention, when performing the normal operation, the second node and the third node are electrically connected, and the first transistor controls the potential of the first node to be the on level in accordance with the input signal. When performing the all-on output, since a potential of the third node becomes the on level and the potentials of the; first and second nodes become the off level, the output transistor turns off and the potential of the output terminal becomes the on level. In this manner, the shift register can perform the normal operation and the all-on output selectively.

According to the seventh aspect of the present invention, when performing the normal operation, the first transistor controls the potential of the first node to be the on level in accordance with the input signal. When performing the all-on output, the potentials of the first and second nodes become the off level, the output transistor turns off, and the potential of the output terminal becomes the on level. In this manner, the shift register can perform, the normal operation and the all-on output selectively.

According to the eighth aspect of the present invention, when performing the normal operation, an output signal and the potential of the second node can be controlled to be the off level, using the all-on control signal having the off level and supplied to the second conduction terminals of the three transistors.

According to the ninth aspect of the present invention, it is possible to control the potential of the first node using the first and second transistors, and prevent a high voltage from, being applied between terminals of a transistor connected to the first node.

According to the tenth aspect of the present invention, the potential of the first node can be directly controlled using the first and second transistors.

According to the eleventh aspect of the present invention, a scanning direction of the shift register can be switched using the selection circuit.

According to the twelfth aspect of the present invention, circuit amount of the shift register can be reduced by outputting a plurality of signals from one unit circuit.

According to the thirteenth aspect of the present invention, a reliable display device can be configured using a shift register which can perform the initialization certainly.

BRIEF DESCRIPTION OF THE DRAWINGS

FIG. 28 is a circuit diagram of a unit circuit of the

MODES FOR CARRYING OUT THE INVENTION

In the following, shift registers according to embodiments of the present invention will be described with reference to the drawings. In the following description, when a conduction terminal of a transistor can be either a source terminal or a drain terminal, one conduction terminal is fixedly called a source terminal and the other conduction terminal is fixedly called a drain terminal. Furthermore, a signal which is input or output via a certain terminal is called by a same name as that of the terminal (for example, a signal which is input via a clock terminal OKA is referred to as a clock signal CKA). Furthermore, a potential which turns on the transistor when supplied to a gate terminal is referred to as "on potential", and a potential which turns off the transistor when supplied to the gate terminal is referred to as "off potential". For example, for an N-channel type transistor, a high level potential is the on potential and a low level potential is the off potential. Furthermore, it is assumed that a threshold voltage of the transistor is Vth, the high level potential is VDD, and the low level potential is VSS.

(First Embodiment)

Figure 1:
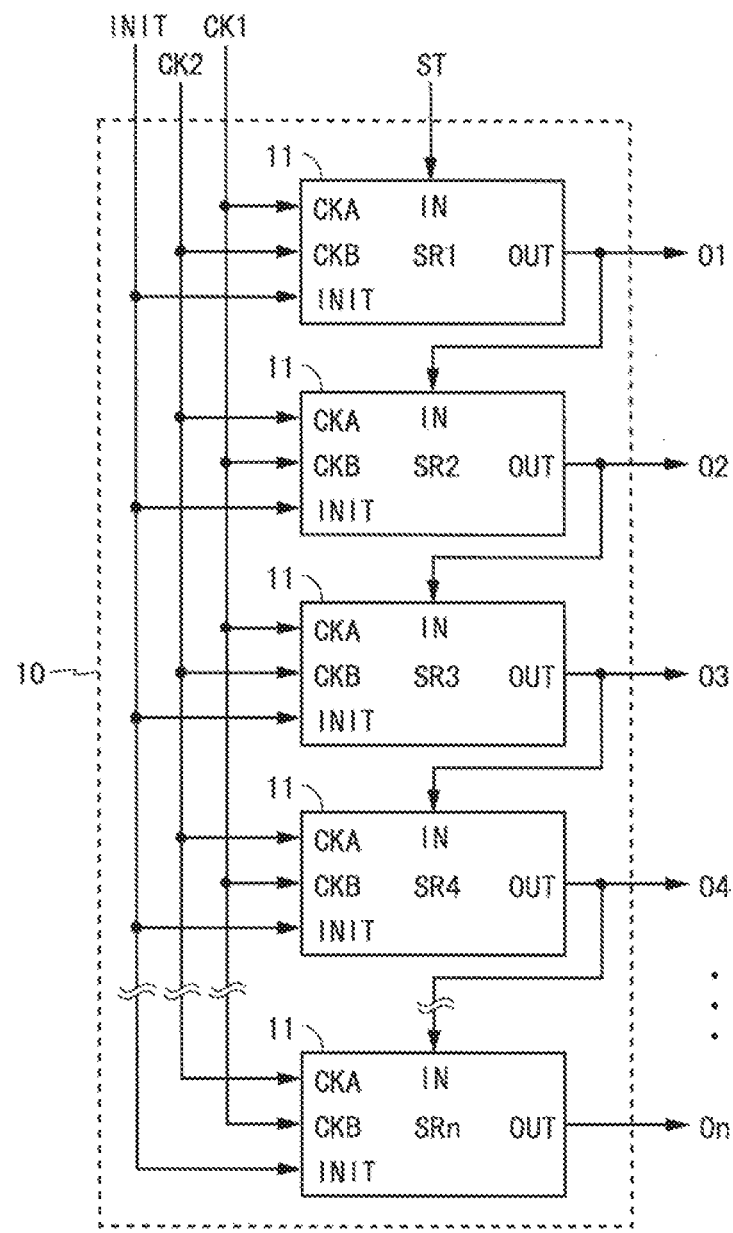
FIG. 1 is a block diagram showing a configuration of a shift register according to a first embodiment of the present invention.

FIG. 1 is a block diagram, showing a configuration, of a shift register according to a first embodiment of the present invention. A shift register 10 shown in FIG. 1 has a configuration in which n (n is an integer not less than 2) unit circuits 11 are connected in multi-stage. The unit circuit 11 has an input terminal IN, clock terminals CKA, CKB, an initialization terminal INIT, and an output terminal OUT. A start signal ST, two-phase clock signals CK1, CK2, and an initialization signal INIT are supplied to the shift register 10 from an outside. Hereinafter, a unit circuit in an i-th stage (i is an integer not less than 1 and not more than n) may be referred to as SRi.

The start signal ST is supplied to the input terminal IN of the unit circuit 11 in a first stage. The clock signal CK1 is supplied to the clock terminal CKA of the unit circuit 11 in an odd-numbered stage and the clock terminal CKB of the unit circuit 11 in an even-numbered stage. The clock signal CK2 is supplied to the clock terminal CKB of the unit circuit 11 in the odd-numbered stage and the clock terminal CKA of the unit circuit 11 in the even-numbered stage. The initialization signal INIT is supplied, to the initialization terminals INIT of the n unit circuits 11. An output signal OUT of the unit circuit 11 is output to the outside as output signals O1 to On, and is supplied to the input terminal IN of the unit circuit 11 in a next stage. The high level potential VDD and the low-level potential VSS are supplied to the n unit circuits 11 from a power supply circuit (not shown).

Figure 2:
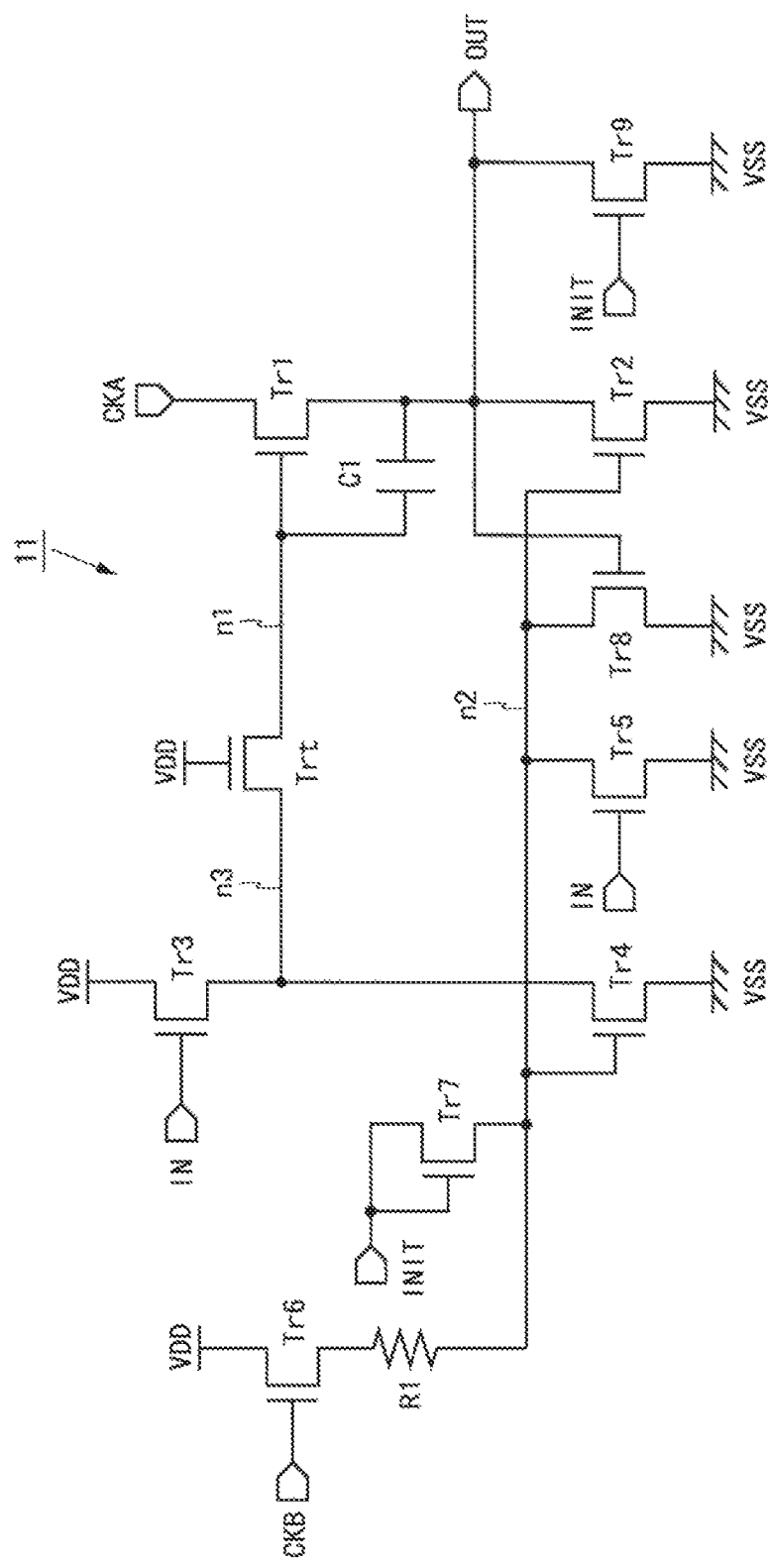
FIG. 2 is a circuit diagram of a unit circuit of the shift register shown in FIG. 1.

FIG. 2 is a circuit diagram of the unit circuit 11. The unit circuit 11 shown in FIG. 2 includes ten N-channel type transistors Tr1 to Tr9, Trt, a capacitor C1, and a resistor R1. A drain terminal of the transistor Tr1 is connected to the clock terminal CKA. A source terminal of the transistor Tr1 is connected to drain terminals of the transistors Tr2, Tr9, a gate terminal of the transistor Tr8, and the output terminal OUT. A gate terminal of the transistor Tr1 is connected to one conduction terminal (right-side terminal in FIG. 2) of the transistor Trt. The other conduction terminal of the transistor Trt is connected to a source terminal of the transistor Tr3 and a drain terminal of the transistor Tr4. A gate terminal of the transistor Tr2 is connected to a gate terminal of the transistor Tr4, drain terminals of the transistors Tr5, Tr8, a source terminal of the transistor Tr7, and one end (lower end in FIG. 2) of the resistor R1. Gate terminals of the transistors Tr3, Tr5 are connected to the input terminal IN. A gate terminal of the transistor Tr6 is connected to the clock terminal CKB, and a source terminal of the transistor Tr6 is connected to the other end of the resistor R1. A drain terminal and a gate terminal of the transistor Tr7 are connected to the initialization terminal INIT. The high level potential VDD is fixedly applied to drain terminals of the transistors Tr3, Tr6 and a gate terminal of the transistor Trt. The low level potential VSS is fixedly applied to source terminals of the transistors Tr2, Tr4, Tr5, Tr8, Tr9. The capacitor C1 is provided between the gate terminal and the source terminal of the transistor Tr1 and functions as a bootstrap capacitor. Hereinafter, a node to which the gate terminal of the transistor Tr1 is connected is referred to as n1, a node to which the gate terminal of the transistor Tr2 is connected is referred to as n2, and a node to which the source terminal of the transistor Tr3 is connected is referred to as n3.

In the unit circuit 11, the transistors Tr3 to Tr8, Trt, and the resistor R1 function as a node control unit for controlling potentials of the nodes n1, n2. The transistor Tr1 has the drain terminal connected to the clock terminal CKA, the source terminal connected to the output terminal OUT, and the gate terminal connected to the node n1, and functions as an output transistor. The transistor Tr2 has the drain terminal connected to the output terminal OUT, the source terminal to which the off potential (low level potential VSS) is applied, and the gate terminal connected to the node n2, and functions as an output reset transistor. The transistor Tr8 has the drain terminal connected to the node n2, the source terminal to which the off potential is applied, and the gate terminal connected to the output terminal OUT, and functions as a node stabilization transistor. The transistor Tr9 has the drain terminal connected to the output terminal OUT, the source terminal to which the off potential is applied, and the gate terminal to which the initialization signal INIT is supplied, and functions as an output initialization transistor.

The transistor Tr3 functions as a first transistor for controlling the potential of the node n1 to be an on level, by applying the on potential (nigh level potential VDD) to the node n3 in accordance with an input signal IN. The transistor Tr4 functions as a second transistor for controlling the potential of the node n1 to be an off level in accordance with the potential of the node n2, The transistor Tr5 functions as a third transistor for controlling the potential of the node n2 to be the off level in accordance with the input signal IN. The transistor Tr6 functions as a fourth transistor for controlling the potential of the node n2 to be the on level in accordance with a clock signal CKB. The transistor Tr7 functions as a fifth transistor for controlling the potential of the node n2 to be the on level in accordance with the initialization signal INIT. The transistor Trt has a conduction terminal connected to the node n1, a conduction terminal connected to the source terminal of the transistor Tr3 and the drain terminal of the transistor Tr4, and the gate terminal to which the on potential is fixedly applied.

Figure 3:
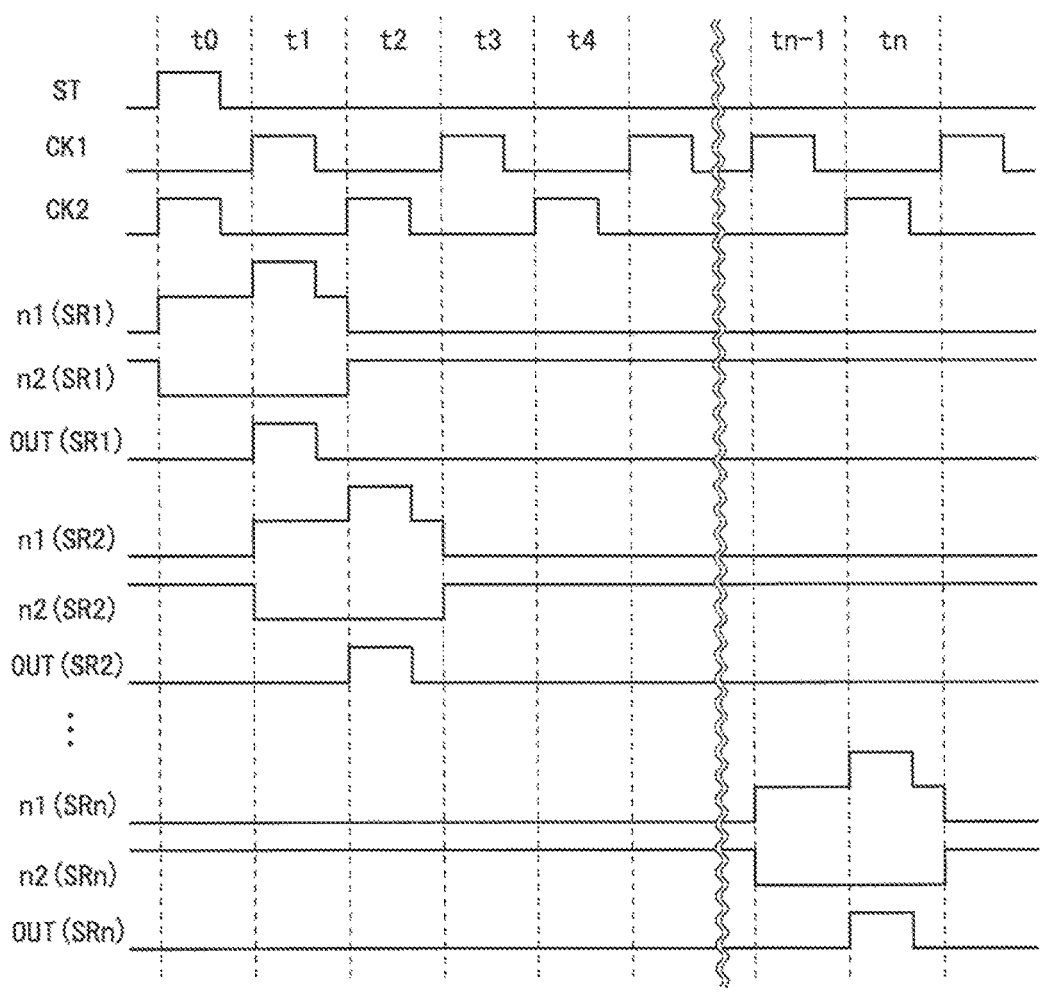
FIG. 3 is a timing chart of the shift register shown in FIG. 1.

The shift register 10 performs an initialization when the initialization signal INIT is at the high level, and performs a normal operation when the initialization signal INIT is at the low level. FIG. 3 is a timing chart of the shift register 10 when performing the normal operation. When performing the normal operation, since the initialization signal INIT is at the low level, the transistors Tr7, Tr9 turn off. Thus, these transistors do not affect the normal operation of the shift register 10.

When performing the normal operation, the clock signal CK1 becomes the high level and the low level in a predetermined cycle. A high level period of the clock signal CK1 is shorter than ½ cycle. The clock signal CK2 is a signal obtained by delaying the clock signal CK1 by ½ cycle. The start signal ST becomes the high level in a high level period of the clock signal CK2 in a period t0.

The normal operation of the unit circuit SR1 in the first stage will be described below. In the unit circuit SR1, the start signal ST is the input signal IN, the clock signal CK1 is the clock signal OKA, and the clock signal CK2 is the clock signal CKB.

In the period t0, the input signal IN changes to the high level. Thus, the transistor Tr3 turns on and the potential of the node n3 is increased to (VDD−Vth). Since the high level potential VDD is applied to the gate terminal of the transistor Trt, the node n1 and the node n3 are electrically connected. Thus, the potential of the node n1 is also increased to (VDD−Vth). When the potential of the node n1 becomes (VDD−Vth), the transistor Trt turns off, and the nodes n1, n3 become a floating state. When the potential of the node n1 exceeds the on level of the transistor on the way, the transistor Tr1 turns on. Since the clock signal CKA is at the low level at this time, the output signal OUT remains at the low level.

Furthermore, when the input signal IN changes to the high level, the transistor Tr5 turns on. Since the clock signal CKB is at the high level at this time, the transistor Tr6 also turns on. Since the resistor R1 is provided between the source terminal of the transistor Tr6 and the node n2, when both of the transistors Tr5, Tr6 turn on, the potential of the node n2 becomes a potential close to the low level potential VSS (off potential of transistor). Thus, the transistors Tr2, Tr4 turn off. In a latter part of the period t0, the input signal IN changes to the low level. Thus, the transistors Tr3, Tr5 turn off. After that, the nodes n1, n3 keep the high level potential in the floating state.

In a period t1, the clock signal CKA changes to the high level. Since the transistor Tr1 is in an on state at this time, the potential of the output terminal OUT is increased and the output signal OUT becomes the high level. Accordingly, the potential of the node n1 in the floating state is pushed up; via the capacitor C1 and parasitic capacitance of the transistor Tr1, and the potential of the node n1 is increased to (VDD−Vth+α) (α is push-up voltage) (bootstrap operation). Since the potential of the node n1 becomes higher than (VDD+Vth), the potential of the output terminal OUT becomes equal to the high level potential VDD (high level potential without threshold drop) of the clock signal CKA, At this time, the transistor Tr8 turns on and fixes the potential of the node n2 to the low level potential VSS. In a latter part of the period t1, the clock signal CKA changes to the low level. Thus, the output signal OUT becomes the low level, the potential of the node n1 returns to the same potential (VDD−Vth) as in the period t0, and the transistor Tr8 turns off.

In a period t2, the clock signal CKB changes to the high level. Thus, the transistor Tr6 turns on and the high level potential is applied to the node n2. Since the transistor Tr5 is in an off state at this time, the potential of the node n2 becomes (VDD−Vth). Thus, the transistor Tr4 turns on, the potentials of the nodes n1, n3 become the low level, and the transistor Tr1 turns off. When the potential of the node n2 exceeds the on level of the transistor on the way, the transistor Tr2 turns on, and the output signal OUT is fixed to the low level again.

In a latter part of the period t2, the clock signal CKB changes to the low level. Thus, the transistor Tr6 turns off. After that, in a high level period of the clock signal CKB, the transistor Tr6 turns on and the high level potential is applied to the node n2. In a low level period of the clock signal CKB, the node n2 keeps the high level potential in the floating state. In this manner, the output signal OUT of the unit circuit SR1 becomes the high level (potential is VDD) in the high level period of the clock signal CK1 in the period t1.

The output signal OUT of the unit circuit SR1 is supplied to the input terminal IN of the unit circuit SR2 in a second stage. The unit circuit SR2 operates in periods t1 to t3 in a manner similar to that in which the unit circuit SR1 operates in the periods t0 to t2. The output signal OUT of the unit circuit SR2 is supplied to the input terminal IN of the unit circuit SR3 in a third stage. The unit circuit SR3 operates in periods t2 to t4 in a manner similar to that in which the unit circuit SR1 operates in the periods t0 to t2. The n unit circuits 11 sequentially perform similar operations, with delaying by ½ cycle of the clock signal CK1. Therefore, the output signals O1 to On of the shift register 10 sequentially become the high level for a time having the same length as the high level period of the clock signal CK1, with delaying by ½ cycle of the clock signal CK1.

Next, the initialization of the shift register 10 will be described. The initialization of the shift register 10 is performed, for example, when a state of the shift register 10 is undefined, or when all of the output signals O1 to On of the shift register 10 are temporarily set to the off level (here, low level). When performing the initialization, the initialization signal INIT becomes the high level.

In the unit circuit 11, when the initialization signal INIT changes to the high level, the transistor Tr7 turns on and the potential of the node n2 becomes (VDD−Vth). Thus, the transistor Tr4 turns on, the potentials of the nodes n1, n3 become the low level, and the transistor Tr1 turns off. Furthermore, the transistor Tr2 turns on and the output signal OUT becomes the low level.

The input signal IN of the unit circuit 11 is the output signal OUT of the unit circuit 11 in a previous stage. Thus, when the output signal OUT of the unit circuit 11 in the previous stage becomes the low level, the transistors Tr3, Tr5 turn off. Furthermore, when the output signal OUT becomes the low level, the transistor Tr8 turns off. Still further, when the initialization signal INIT changes to the high level, the transistor Tr9 turns on and the low level potential VSS is applied to the output terminal OUT. In this manner, when the initialization signal INIT changes to the high level, the potential of the node n1 and the output signal OUT become the low level and the potential of the node n2 becomes the high level.

Before the initialization, the output signal OUT is undefined and may be at the high level. When the output signal OUT is at the high level, the transistor Tr8 turns on. Thus, in a unit circuit not including the transistor Tr9, even if the initialization signal INIT becomes the high level and the transistor Tr7 turns on, the potential of the node n2 may not become the high level.

In contrast, in the unit circuit 11, even if the output signal OUT is at the high level before the initialization, when the initialization signal INIT changes to the high level, the transistor Tr9 turns on, the output signal OUT becomes the low level, and the transistor Tr8 turns off. Since the transistor Tr7 turns on at this time, the potential of the node n2 becomes the high level. Therefore, according to the shift register 10, the initialization can be performed certainly.

As described above, the unit circuit 11 of the shift register 10 according to the present embodiment includes an output transistor (transistor Tr1) having a first conduction terminal connected to a clock terminal for inputting a clock signal, a second conduction terminal connected to an output terminal for outputting the clock signal, and a control terminal connected to a first node (node n1), an output reset transistor (transistor Tr2) having a first conduction terminal connected to the output terminal, and a second conduction terminal to which the off potential is applied, and a control terminal connected to a second node (node n2), a node control unit (transistors Tr3 to Tr8 and resistor R1) for controlling potentials of the first and second nodes, and an output initialization transistor (transistor Tr9) having a first conduction terminal connected to the output terminal, a second conduction terminal to which the off potential is applied, and a control terminal to which the initialization signal that becomes the on level when performing the initialization is supplied. The node control unit includes a node stabilization transistor (transistor Tr8) having a first conduction terminal connected to the second node, a second conduction terminal to which the off potential is applied, and an control terminal connected to the output terminal. In the unit circuit 11, when performing the initialization, since the output initialization transistor turns on, the off potential is applied to the output terminal and the node stabilization transistor turns off. Therefore, when performing the initialization, it is possible to control the potential of the second node to be a desired level and initialize the shift register certainly, irrespective of a state of the node stabilization transistor before the initialization.

Furthermore, the node control unit includes a first transistor (transistor Tr3) for controlling the potential of the first node to be the on level in accordance with an input signal of the unit circuit, a second transistor (transistor Tr4) for controlling the potential of the first node to be the off level in accordance with the potential of the second node, a third transistor (transistor Tr5) for controlling the potential of the second node to be the off level in accordance with the input signal, and a fourth transistor (transistor Tr6) for controlling the potential of the second node to be the on level in accordance with a second clock signal of the unit circuit. Therefore, based on the input signal and the second clock signal, a state of the unit circuit can be switched between a state in which the potential of the first node is at the on level and the potential of the second node is at the off level, and an opposite state. Furthermore, the node control unit includes a fifth transistor (transistor Tr7) for controlling the potential of the second node to be the on level in accordance with the initialization signal. Therefore, the potential of the second node can be controlled to be the on level when performing the initialization.

Furthermore, the off potential is fixedly applied to second conduction terminals of the output reset transistor, the node stabilization transistor, and the output initialization transistor. Therefore, the output signal and the potential of the second node can be controlled to be the off level, using the off potential fixedly applied to the second conduction terminals of these transistors. Furthermore, the node control unit includes the transistor Trt having a conduction terminal connected to the first node, a conduction terminal connected to one conduction terminals of the first and second transistors, and a control terminal to which the on potential is fixedly applied. Therefore, it is possible to control the potential of the first node using the first and second transistors, and prevent a high voltage from being applied between terminals of transistors connected to the first node.

As for the shift register 10 according to the present embodiment, following variants can be configured. The shift registers according to the variants have configurations in which the unit circuits described below are connected in multi-stage, in place of the unit circuits 11. In a first variant, a unit circuit obtained by deleting the capacitor C1 from, the unit circuit 11 is used. In this case, the parasitic capacitance of the transistor Tr1 can be used in place of the capacitor C1. In a second variant, a unit circuit obtained by deleting the transistor Trt from the unit circuit 11 is used. In this case, the source terminal of the transistor Tr3 and the drain terminal of the transistor Tr4 are connected to the node n1. Therefore, the potential of the node n1 can be directly controlled using the transistors Tr3, Tr4 . In a third variant, a unit circuit obtained based on the unit circuit 11 by connecting the transistor Tr6 and the resistor R1 in a reverse order is used. In a fourth variant, a unit circuit obtained based on the unit circuit 11 by replacing the resistor R1 with one or more diodes is used. In a fifth variant, a unit circuit obtained based on the unit circuit 11 by connecting the source terminal of the transistor Tr5 to the initialization terminal INIT is used as a unit circuit in the first stage. According to the shift register according to the fifth variant, malfunction due to noise can be prevented. In a sixth variant, a unit circuit obtained based on the unit circuit 11 by applying the high level potential VDD to the drain terminal of the transistor Tr7 is used. Effects similar to those attained by the shift register 10 can also be attained by the shift registers according to these variants.

(Second Embodiment)

Figure 4:
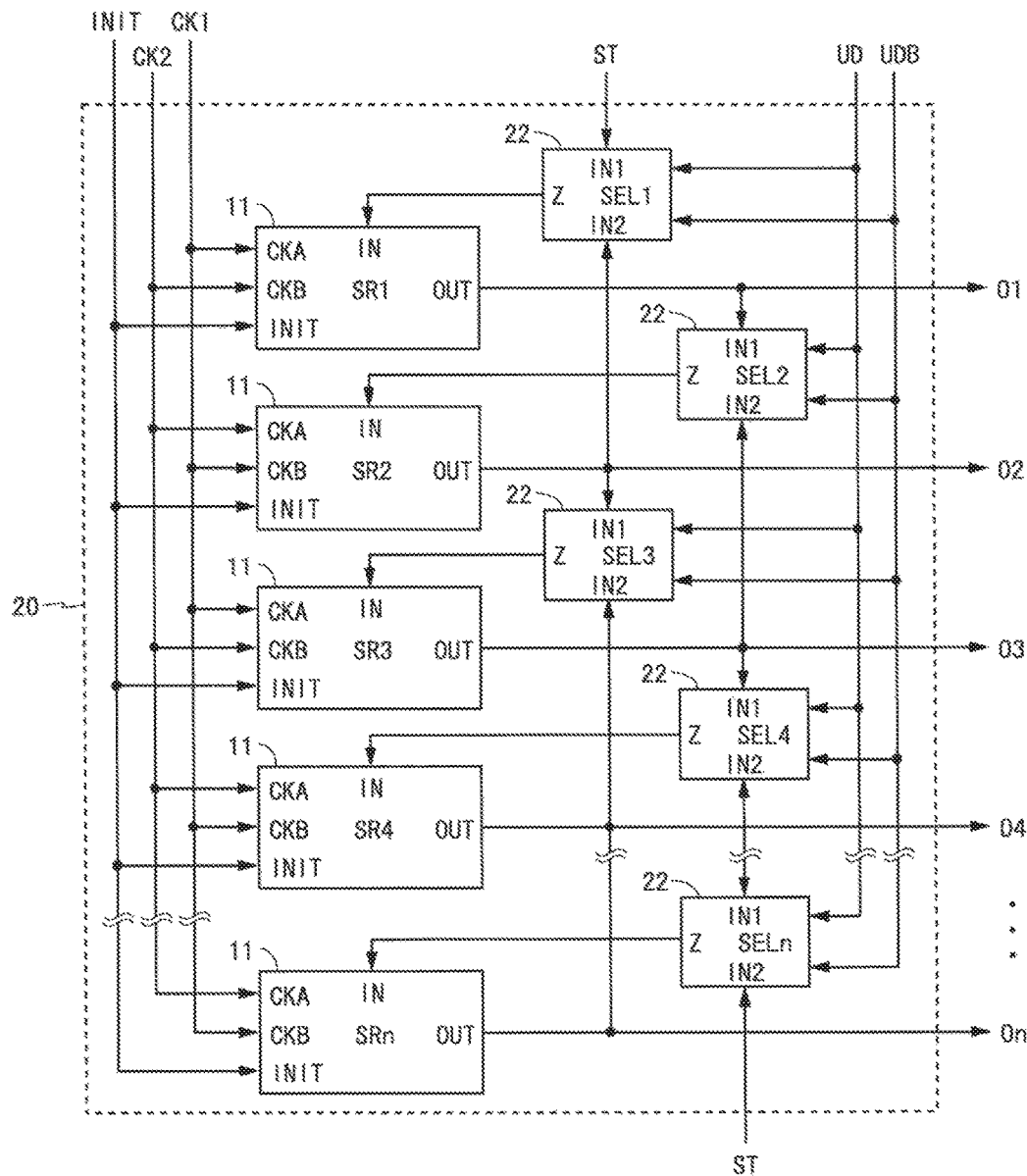
FIG. 4 is a block diagram showing a configuration of a shift register according to a second embodiment of the present invention.

FIG. 4 is a block diagram showing a configuration of a shift register according to a second embodiment of the present invention. A. shift register 20 shown in FIG. 4 is obtained by adding a function of switching a scanning direction (shift direction) to the shift register 10 according to the first embodiment. The shift register 20 includes the n unit circuits 11 and n selection circuits 22. The n unit circuits 11 and the n selection circuits 22 are corresponded in one-to-one. Hereinafter, a selection circuit corresponding to the unit circuit SRi in the i-th stage may be referred to as a selection circuit SELi in the i-th stage. The selection circuit 22 has input terminals IN1, IN2, control terminals UD, UDB, and an output terminal Z. The start signal ST, the two-phase clock signals CK1, CK2, the initialization signal INIT, and control signals UD, UDB are supplied to the shift register 20 from the outside. The control signal UDB is a negative signal of the control signal UD.

The initialization signal INIT and the clock signals CK1, CK2 are supplied to the n unit circuits 11 in a same manner as in the shift register 10 according to the first embodiment. The start signal ST is supplied to the input terminal IN1 of a selection circuit SEL1 in the first stage and the input terminal IN2 of a selection circuit SELn in a last stage. The control signals UD, UDB are supplied to the control terminals UD, UDB of the n selection circuits 22, respectively. The output terminal Z of the selection circuit SELi in the i-th stage is connected to the input terminal IN of the unit circuit SRi in the i-th stage. The output signal OUT of the unit circuit 11. is output to the outside as the output signals O1 to On. The output signal OUT of the unit circuit SRi in the i-th stage is supplied to the input terminal IN1 of a selection circuit SELi+1 in the next stage and the input terminal IN2 of a selection circuit SELi−1 in the previous stage.

Figure 5:
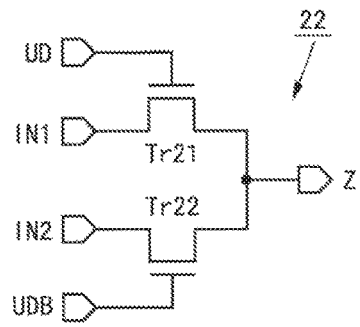
FIG. 5 is a circuit diagram of a selection circuit of the shift register shown in FIG. 4.

FIG. 5 is a circuit diagram of the selection circuit 22. The selection circuit 22 shown in FIG. 5 includes two transistors Tr21, Tr22. One conduction terminals (left-side terminals in FIG. 5) of the transistors Tr21, Tr22 are connected to the input terminals IN1, IN2, respectively. The other conduction terminals of the transistors Tr21, Tr22 are connected to the output terminal Z. Gate terminals of the transistors Tr21, Tr22 are connected to the control terminals UD, UDB, respectively.

When the control signal UD is at the high level and the control signal UDB is at the low level, the transistor Tr21 turns on and the transistor Tr22 turns off. At this time, the output terminal Z is electrically connected to the input terminal IN1, and the output signal OUT of the unit circuit SRi−1 in the previous stage becomes the input signal IN of the unit circuit SRi. Therefore, the shift register 20 operates in a manner similar to the shift register 10 according to the first embodiment (normal direction scan).

When the control signal UD is at the low level and the control signal UDB is at the high level, the transistor Tr21 turns off and the transistor Tr22 turns on. At this time, the output terminal Z is electrically connected to the input terminal IN2, and the output signal OUT of the unit circuit SRi+1 in the next stage becomes the input signal IN of the unit circuit SRi. Therefore, the shift register 20 performs a shift operation in a direction opposite to that in the shift register 10 according to the first embodiment (reverse direction scan).

As described above, the shift register 20 according to the present embodiment includes a plurality of the selection circuits 22 for selecting one of the output signal OUT of the unit circuit SRi−1 in the previous stage and the output signal OUT of the unit circuit SRi+1 in the next stage, as the input signal IN of the unit circuit SRi. Therefore, a scanning direction of the shift register 20 can be switched using the selection circuit 22, (Third Embodiment)

Figure 6:
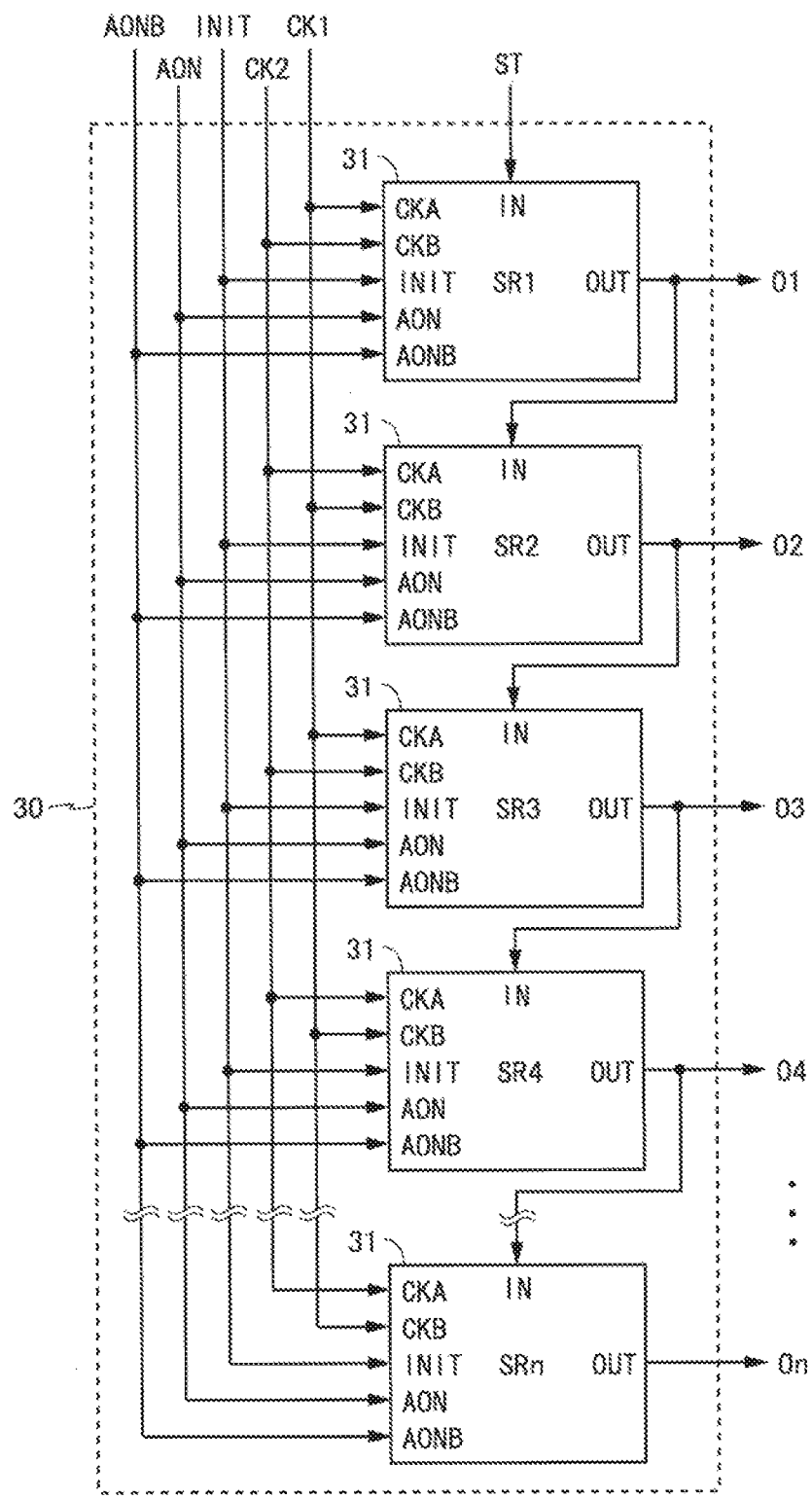
FIG. 6 is a block diagram showing a configuration of a shift register according to a third embodiment of the present invention.

FIG. 6 is a block diagram showing a configuration of a shift register according to a third embodiment of the present invention. A shift register 30 shown in FIG. 6 has a configuration in which n unit circuits 31 are connected in multi-stage. The unit circuit 31 has the input terminal IN, the clock terminals CKA, CKB, the initialization terminal INIT, all-on control terminals AON, AONB, and the output terminal OUT. The start signal ST, the two-phase clock signals CK1, CK2, the initialization signal INIT, an all-on control signal AON, and a negative signal AONB of the all-on control signal (hereinafter abbreviated as negative signal AONB) are supplied to the shift register 30 from the outside.

The start signal ST is supplied to the input terminal IN of the unit circuit 31 in the first stage. The clock signals CK1, CK2 and the initialization signal INIT are supplied to the n unit circuits 31 in the same manner as in the shift register 10 according to the first embodiment. The all-on control signal AON and the negative signal AONB are supplied to the all-on control terminals AON, AONB of the n unit circuits 31, respectively. The output signal OUT of the unit circuit 31 is output to the outside as the output signals O1 to On, and is supplied to the input terminal IN of the unit circuit 31 in the next stage.

Figure 7:
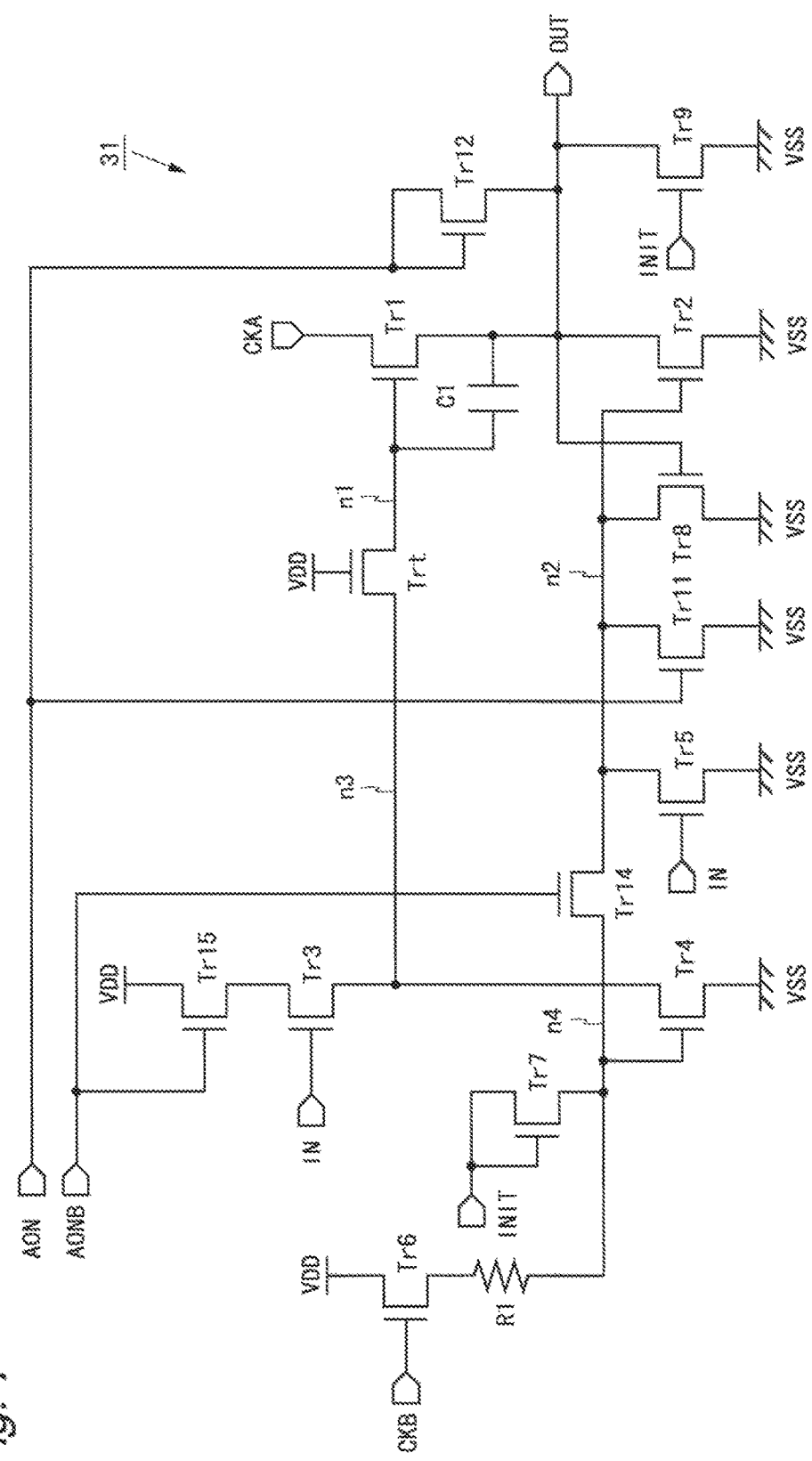
FIG. 7 is a circuit diagram of a unit circuit of the shift register shown in FIG. 6.

FIG. 7 is a circuit diagram of the unit circuit 31. The unit circuit 31 shown in FIG. 7 includes fourteen N-channel type transistors Tr1 to Tr9, Tr11, Tr12, Tr14, Tr15, Trt, the capacitor C1, and the resistor R1. The unit circuit 31 is different from, the unit circuit 11 in the following points. In the unit circuit 31, the gate terminal of the transistor Tr2 is connected to drain terminals of the transistors Tr5, Tr8, Tr11 and one conduction terminal (right-side terminal in FIG. 7) of the transistor Tr14. The other conduction terminal of the transistor Tr14 is connected to the gate terminal of the transistor Tr4, the source terminal of the transistor Tr7, and one end (lower end in FIG. 7) of the resistor R1. The drain terminal of the transistor Tr3 is connected to a source terminal of the transistor Tr15. The high level potential VDD is applied, to a drain, terminal of the transistor Tr15, and gate terminals of the transistors Tr14, Tr15 are connected to the all-on control terminal AONB (input terminal of the negative signal AONB) . A drain terminal of the transistor Tr12 and gate terminals of the transistors Tr11, Tr12 are connected to the all-on control terminal AON. A source terminal of the transistor Tr12 is connected, to the output terminal OUT and the like. The low level potential VSS is applied to a source terminal of the transistor Tr11. Hereinafter, a node to which the gate terminal of the transistor Tr4 is connected is referred to as n4.

In the unit circuit 31, the transistors Tr3 to Tr8, Tr11, Tr14, Tr15, Trt, and the resistor R1 function as a node control unit for controlling the potentials of the nodes n1, n2. Functions of the transistors Tr1 to Tr9, Trt are the same as those in the unit circuit 11. However, the transistor Tr7 controls the potential of the node n2 to be the on level, by controlling the potential of the node n4 to be the on level (high level) in accordance with the initialization signal INIT. The transistor Tr12 controls the potential of the output terminal OUT to be the on level in accordance with the all-on control signal AON. The transistor Tr15 supplies the on potential to a first transistor (transistor Tr3) in accordance with the negative signal AONB. The transistor Tr14 has a conduction terminal connected to the node n2, a conduction terminal connected to the node n4 (corresponding to third node) , and the gate terminal to which the negative signal AONB is supplied. The transistor Tr11 controls the potential of the node n2 to be the off level (low level) in accordance with the all-on control signal AON.

The shift register 30 performs the initialization when the initialization signal INIT is at the high level and the all-on control signal AON is at the low level, performs the normal operation when the initialization signal INIT and the all-on control signal AON are at the low level, and performs the all-on output when the all-on control signal AON is at the high level. Note that there are no cases in which the initialization signal INIT is at the low level and the all-on control signal AON is at the high level.

When performing the normal operation, the initialization signal INIT and the all-on control signal AON become the low-level and the negative signal AONB becomes the high level. Thus, the transistors Tr7, Tr9, Tr11, Tr12 turn off and the transistors Tr14, Tr15 turn on. Therefore, the high level potential VDD is applied to the drain terminal of the transistor Tr3, and the node n2 and the node n4 are electrically connected. When performing the normal operation, the unit circuit 31 becomes the same circuit as the unit circuit 11 and performs the same operations as the unit circuit 11.

Figure 8:
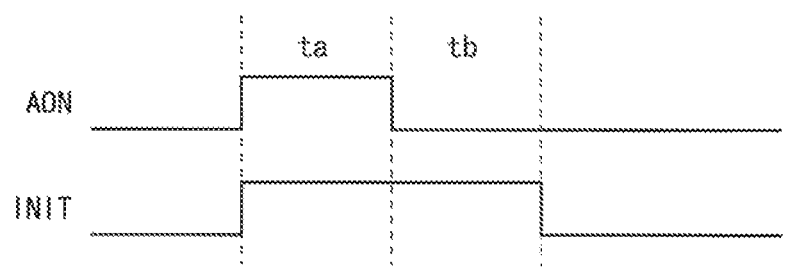
FIG. 8 is a timing chart of the shift register shown in FIG. 6 when performing an all-on output and an initialization.

FIG. 8 is a timing chart of the shift register 30 when performing the all-on output and the initialization. Before performing the all-on output and the initialization, the initialization signal INIT and the all-on control signal AON are at the low level and the negative signal AONB is at the high level.

At first, in a period ta, the initialization signal INIT and the all-on control signal AON change to the high level, and the negative signal AONB changes to the low level. Thus, the transistors Tr7, Tr9, Tr11, Tr12 turn on, the transistors Tr14, Tr15 turn off, and the node n2 and the node n4 are electrically disconnected. A potential of the node n4 becomes the high level by an action of the transistor Tr7. The potential of the node n2 becomes the low level by an action of the transistor Tr11, and the transistor Tr2 turns off. When the potential of the node n4 becomes the high level, the transistor Tr4 turns on, the potentials of the nodes n1, n3 become the low level, and the transistor Tr1 turns off. In this manner, the transistors Tr1, Tr2 turn off and the transistors Tr9, Tr12 turn on.

The unit circuit 31 is designed so that a drive capability of the transistor Tr12 is larger than that of the transistor Tr9. For example, a channel width of the transistor Tr12 is designed so as to be larger than that of the transistor Tr9. Thus, when both the transistors Tr9, Tr12 turn on, the output signal OUT becomes the high level and the transistor Tr8 turns on. In this manner, the shift register 30 sets all the output signals OUT to the high level (all-on output).

Next, in a period tb, in a period when the initialization signal INIT is at the nigh level, the all-on control signal AON changes to the low level and the negative signal AONB changes to the high level. Thus, the transistors Tr11, Tr12 turn off and the transistors Tr14, Tr15 turn on. Since the transistor Tr7 is in the on state at this time, the potentials of the nodes n2, n4 become the nigh level. Accordingly, the transistor Tr2 turns on, the output signal OUT becomes the low level, and the transistor Tr8 turns off. In this manner, the shift register 30 sets all of the output signals OUT to the low level (initialization).

Next, at an end of a period tb, the initialization signal INIT changes to the low level. After that, the start signal ST and the clock signals CK1, CK2 are supplied to the shift register 30, and the shift register 30 performs the normal operation.

In the unit circuit 31, as with the unit circuit 11, even if the output signal OUT is at the high level before the initialization, when the initialization signal INIT changes to the high level, the transistor Tr9 turns on, the output signal OUT becomes the low level, and the transistor Tr8 turns off. Since the transistor Tr7 turns on at this time, the potential of the node n2 becomes the high level. Therefore, according to the shift register 30, the initialization can be performed certainly.

As described above, the unit circuit 31 of the shift register 30 according to the present embodiment includes the transistor Tr12 for controlling the potential of the output terminal to be the on level in accordance with the all-on control signal which becomes the on level when performing the all-on output. Therefore, all of the output signals of the shift register 30 can be controlled to be the on level when performing the all-on output.

Furthermore, the node control unit includes the transistor Tr15 for supplying the on potential to a first-transistor (transistor Tr3) in accordance with the negative signal AONB of the all-on control signal, the transistor Tr14 having a conduction terminal connected to the second node, a conduction terminal connected to a third node (node n4), and a control terminal to which, the negative signal AONB of the all-on control signal is supplied, and the transistor Tr11 for controlling the potential of the second node to be the off level in accordance with the all-on control signal AON. A control terminal of a second transistor (gate terminal of transistor Tr4), a second conduction terminal of a fourth transistor (source terminal of transistor Tr6), and a second, conduction terminal of a fifth transistor (source terminal of transistor Tr7) are connected to the third node. Therefore, when performing the normal operation, the second node and the third node are electrically connected, and the first transistor controls the potential of the first node to be the on level in accordance with an input signal. When performing the all-on output, since the potential of the third node becomes the on level and the potentials of the first and second nodes become the off level, the output transistor turns off and the potential of the output terminal becomes the on level. In this manner, the shift register can perform the normal operation and the all-on output selectively.

As for the shift register 30 according to the present embodiment, the first to sixth variants described above can be configured. In the sixth variant, there is used a unit circuit obtained based on the unit circuit 31 by applying the nigh level potential VDD to the drain terminals of the transistors Tr7, Tr12.

(Fourth Embodiment)

Figure 9:
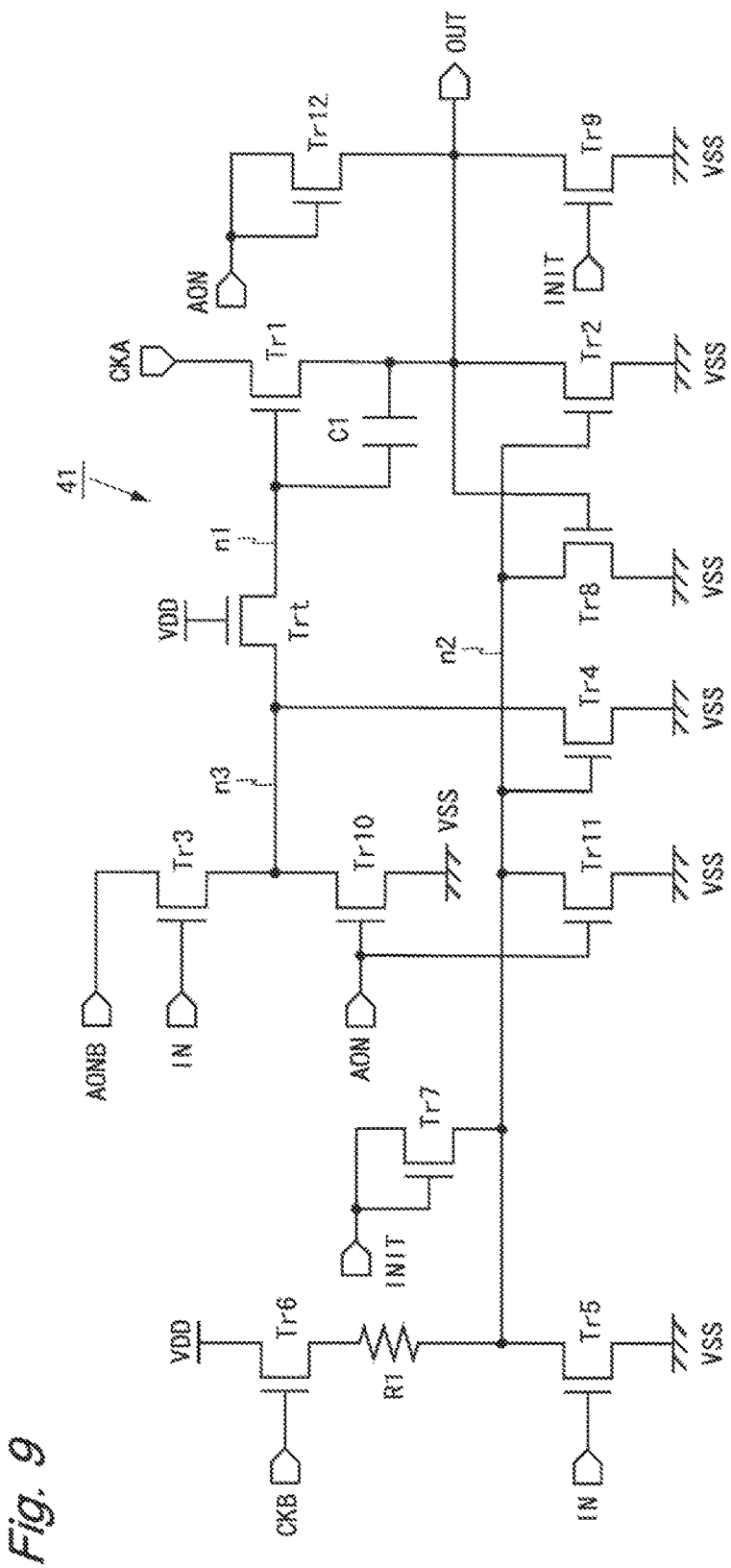
FIG. 9 is a circuit diagram of a unit circuit of a shift register according to a fourth embodiment of the present invention.

A shift register according to a fourth embodiment of the present invention has the configuration shown in FIG. 6. However, the shift register according to the present embodiment includes a unit circuit 41 shown in FIG. 9 in place of the unit circuit 31. The unit circuit 41 shown in FIG. 9 is obtained based on the unit circuit 11 by adding transistors Tr10 to Tr12 and changing a connection point of the drain terminal of the transistor Tr3 to the all-on control terminal AONB.

The unit circuit 41 is different from the unit circuit 11 in the following points. In the unit circuit 41, a drain terminal and a gate terminal of the transistor Tr12 are connected to the all-on control terminal AON. A source terminal of the transistor Tr12 is connected to the output terminal OUT and the like. A drain terminal of the transistor Tr10 is connected to the source terminal of the transistor Tr3 and the like. A drain terminal of the transistor Tr11 is connected to the gate terminal of the transistor Tr2 and the like. Gate terminals of the transistors Tr10, Tr11 are connected to the all-on control terminal AON, and the low level potential VSS is applied to source terminals of the transistors Tr10, Tr11.

In the unit circuit 41, the transistors Tr3 to Tr8, Tr10, Tr11, Trt, and the resistor R1 function as a node control unit for controlling the potentials of the nodes n1, n2. Functions of the transistors Tr1 to Tr9, Trt are the same as those in the unit circuit 11. However, the transistor Tr3 supplies the negative signal AONB of the all-on control signal to the node n1 in accordance with the input signal IN. The transistor Tr12 controls the potential of the output terminal OUT to be the on level in accordance with the all-on control signal AON. The transistor Tr10 controls the potential of the node n1 to be the off level in accordance with the all-on control signal AON. The transistor Tr11 controls the potential of the node n2 to be the off level in accordance with the all-on control signal AON.

The shift register according to the present embodiment performs the initialization when the initialization signal INIT is at the high level, performs the normal operation when the initialization signal INIT and the all-on control signal AON are at the low level, and performs the all-on output when the all-on control signal AON is at the high level. Note that there are no cases in which the initialization signal INIT and the all-on control signal AON become the high level in a same time period.

When performing the normal operation, the initialization signal INIT and the all-on control signal AON become the low level and the negative signal AONB becomes the high level. Thus, the transistors Tr7, Tr9 to Tr12 turn off, and the negative signal AONB having the high level is supplied to the drain terminal of the transistor Tr3. When performing the normal operation, the unit circuit 41 becomes the same circuit as the unit circuit 11 and performs the same operations as the unit circuit 11.

When performing the initialization, the initialization signal INIT becomes the high level. Thus, the transistor Tr7 turns on and the potential of the node n2 becomes (VDD−Vth). Accordingly, the transistor Tr4 turns on, the potentials of the nodes n1, n3 become the low level, and the transistor Tr1 turns off. Furthermore, the transistor Tr2 turns on and the output signal OUT becomes the low level. All of the output signals O1 to On of the shift register 10 become the low level when performing the initialization.

When performing the all-on output, the all-on control signal AON becomes the high level and the negative signal AONB becomes the low level. Thus, the transistors Tr10 to Tr12 turn on, the potentials of the nodes n1 to n3 become the low level, the transistors Tr1, Tr2, Tr4 turn off, and the output signal OUT becomes the high level. Therefore, the transistor Tr8 turns on and the potential of the node n2 is fixed to the low level.

The input signal IN of the unit circuit SR1 in the first stage is the start signal ST, and the input signal IN of the unit circuits SR2 to SRn in the second and subsequent stages is the output signal OUT of the unit circuit in the previous stage. Thus, when performing the all-on output, in the unit circuits SR2 to SRn in the second and subsequent stages, the input signal IN becomes the high level and the transistor Tr3 turns on. In the unit circuit SR1 in the first stage, a state of the transistor Tr3 depends on a level of the start signal ST. In a case where the transistor Tr3 turns on together with the transistor Tr10 when performing the all-on output, the all-on control terminal AONB is electrically connected to the source terminal of the transistor Tr10. Even in this case, since the negative signal AONB is at the low level, the potentials of the nodes n1, n3 become the low level stably.

In the unit circuit 41, as with the unit circuit 11, even if the output signal OUT is at the high level before the initialization, when the initialization signal INIT changes to the high level, the transistor Tr9 turns on, the output signal OUT becomes the low level, and the transistor Tr8 turns off. Since the transistor Tr7 turns on at this time, the potential of the node n2 becomes the high level. Therefore, according to the shift register according to the present embodiment, the initialization can be performed certainly.

As described above, in the unit circuit 41 of the shift register according to the present embodiment, the node control unit includes the transistor Tr10 for controlling the potential of a first node (node n1) to be the off level in accordance with the all-on control signal, and the transistor Tr11 for controlling the potential of a second node (node n2) to be the off level in accordance with the all-on control signal. A first transistor (transistor Tr3) supplies the negative signal AONB of the all-on control signal to the first node in accordance with an input signal. Therefore, when performing the normal operation, the first transistor controls the potential of the first node to be the on level in accordance with the input signal. When performing the all-on output, the potentials of the first and second nodes become the off level, the output transistor turns off, and the potential of the output terminal becomes the on level. In this manner, the shift register can perform the normal operation and the all-on output.

As for the shift register according to the present embodiment, the first to sixth variants described above can be configured. In the sixth variant, there is used a unit circuit obtained based on the unit circuit 41 by applying the high level potential VDD to the drain terminals of the transistors Tr7, Tr12. Furthermore, as a seventh variant, there may be used a unit circuit obtained based on the unit circuit 41 by connecting the source terminals of the transistors Tr10, Tr11 to the initialization terminal INIT. According to the shift register according to the seventh variant, malfunction due to noise can be prevented.

(Fifth Embodiment)

Figure 10:
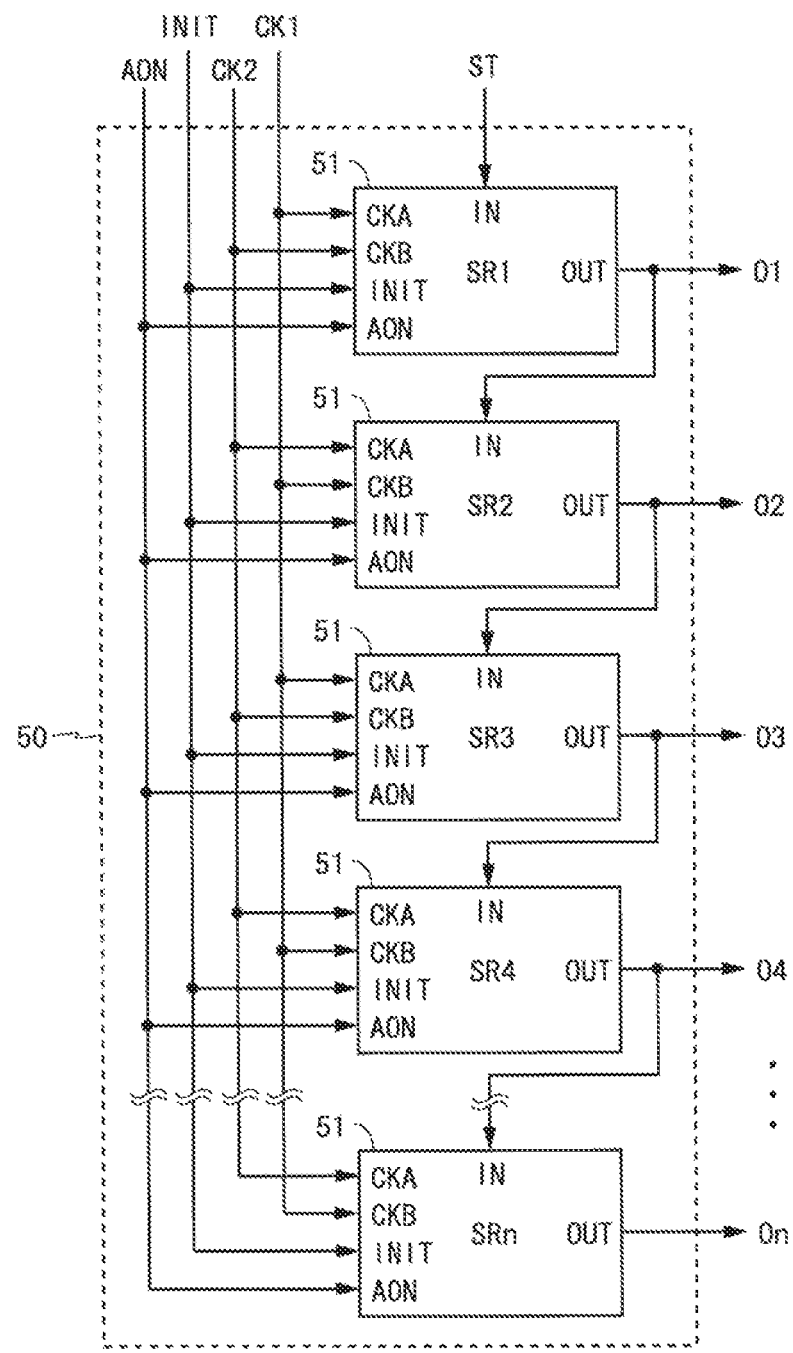
FIG. 10 is a block diagram showing a configuration of a shift register according to a fifth embodiment of the present invention.

FIG. 10 is a block diagram showing a configuration of a shift register according to a fifth embodiment of the present invention. A shift register 50 shown in FIG. 10 has a configuration in which n unit circuits 51 are connected in multi-stage. The unit circuit 51 has the input terminal IN, the clock terminals CKA, CKB, the initialization terminal INIT, the all-on control terminal AON, and the output terminal OUT. The start signal ST, the two-phase clock signals CK1, CK2, the initialization signal INIT, and the all-on control signal AON are supplied to the shift register 50 from the outside.

The start signal ST is supplied to the input terminal IN of the unit circuit 51 in the first stage. The clock signals CK1, CK2, the initialization signal INIT, and the all-on control signal AON are supplied to the n unit circuits 51 in a same manner as in the shift register 30 according to the third embodiment. The output signal OUT of the unit circuit 51 is output to the outside as the output signals O1 to On, and is supplied to the input terminal IN of the unit circuit 51 in the next stage.

Figure 11:
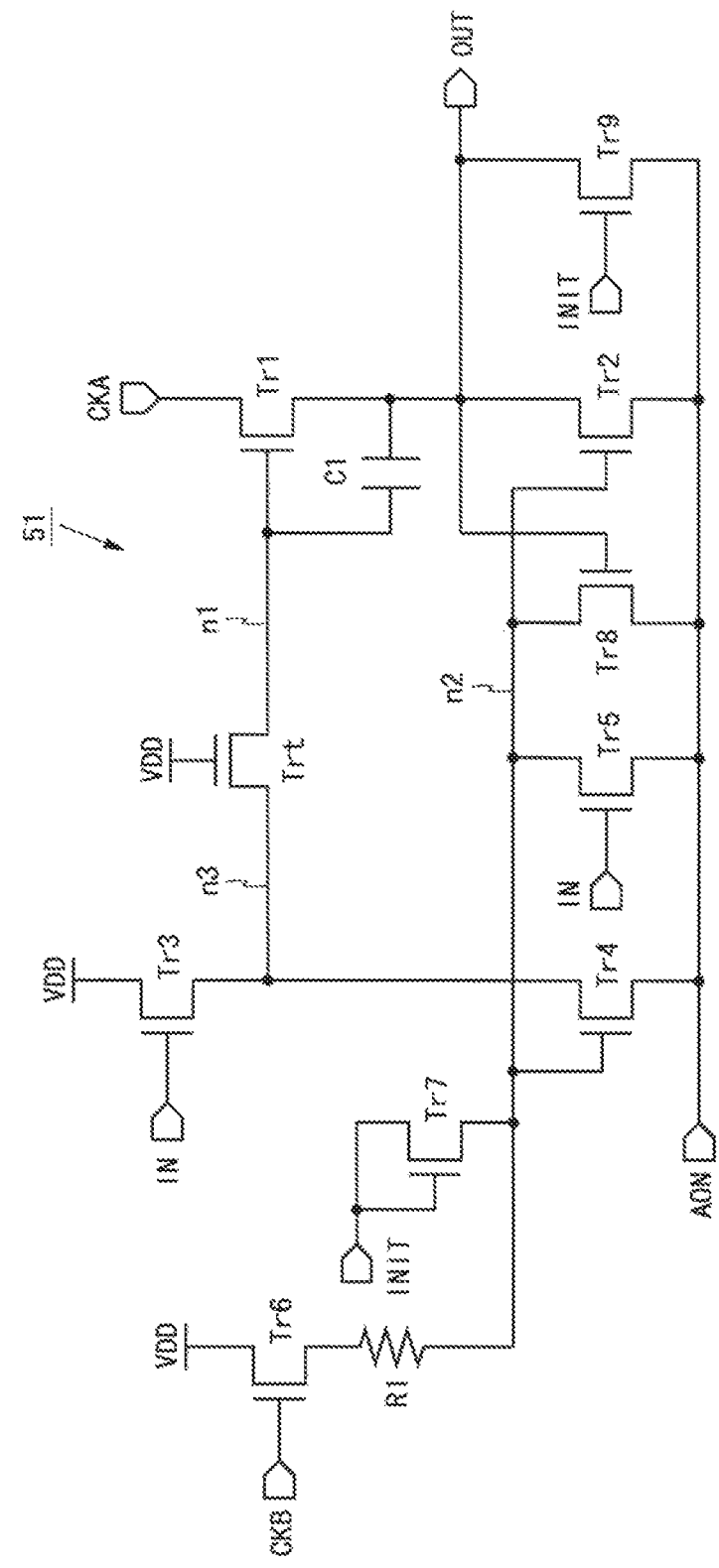
FIG. 11 is a circuit diagram of a unit circuit of the shift register shown in FIG. 10.

FIG. 11 is a circuit diagram of the unit circuit 51. The unit circuit 51 is obtained based on the unit circuit 11 by changing connection points of the source terminals of the transistors Tr2, Tr4, Tr5, Tr8, Tr9 to the all-on control terminal AON.

The shift register 50 performs the initialization when the initialization signal INIT is at the high level and the all-on control signal AON is at the low level, performs the normal operation when the initialization signal INIT and the all-on control signal AON are at the low level, and performs the all-on output when the initialization signal INIT and the all-on control signal AON are at the high level.

When performing the initialization or the normal operation, the all-on control signal AON becomes the low level. Thus, the low level potential VSS is applied to the source terminals of the transistors Tr2, Tr4, Tr5, Tr8, Tr9. When performing the initialization or the normal operation, the unit circuit 51 becomes the same circuit as the unit circuit 11 and performs the same operations as the unit circuit 11.

When performing the all-on output, the initialization signal INIT and the all-on control signal AON become the high level. At this time, the transistors Tr7, Tr9 turn on, the potential of the node n2 becomes the high level, and the transistor Tr2 turns on. In this manner, since the transistors Tr2, Tr9 turn on and the all-on control signal AON having the high level is supplied to the source terminals of the transistors Tr2, Tr9, the output signal OUT becomes the high level.

Note that even when the initialization signal INIT is at the low level and the all-on control signal AON is at the high level, the shift register 50 can perform the all-on output as described below. When the initialization signal INIT is at the low level, the node n2 is in the floating state. When the all-on control signal AON changes from the low level to the high level (when potential changes from VSS to VDD), the potential of the node n2 is pushed up via parasitic capacitance of the transistors Tr2, Tr4, Tr5, Tr8. In a case where an initial value of the potential of the node n2 is (VDD−Vth) before the shift register 50 operates, the potential of the node n2 is changed to (VDD−Vth+α) (α is a push-up voltage) by a push-up. The transistor Tr2 is the output reset transistor and has a size larger than those of the other transistors. Thus, most of the capacitance of the node n2 is the parasitic capacitance of the transistor Tr2, Therefore, the push-up voltage α is approximately equal to (VDD−VSS). As a result, the transistor Tr2 turns on by the push-up, and the output signal OUT becomes the high level. However, when the size of the transistor Tr2 is not so large or when the initial value of the potential of the node n2 is VSS, the shift register 50 may not perform the all-on output correctly. Therefore, in order for the shift register 50 to certainly perform the all-on output, it is necessary to control both the initialization signal INIT and the all-on control signal to be the high level.

In the unit circuit 51, as with the unit circuit 11, even if the output signal OUT is at the high level before the initialization, when the initialization signal INIT changes to the high level, the transistor Tr9 turns on, the output signal OUT becomes the low level, and the transistor Tr8 turns off. Since the transistor Tr7 turns on at this time, the potential of the node n2 becomes the high level. Therefore, according to the shift register 50, the initialization can be performed certainly. As for the shift register 50 according to the present embodiment, the first to sixth variants described above can be configured.

As described above, in the shift register 50 according to the present embodiment, the all-on control signal AON is supplied to second conduction terminals of an output reset transistor, a node stabilization transistor, and an output initialization transistor (source terminals of transistors Tr2, Tr8, Tr9). Therefore, when performing the normal operation, the output signal and the potential of the second node can be controlled to be the off level, using the all-on control signal having the off level and supplied to the second conduction terminals of the three transistors.

(Sixth Embodiment)

In a sixth embodiment, shift registers for outputting a plurality of output signals from one unit circuit will be described. As with the shift register 30 according to the third embodiment, the shift register according to the present embodiment performs the initialization when the initialization signal INIT is at the high level, performs the normal operation when the initialization signal INIT and the all-on control signal AON are at the low level, and performs the all-on output when the all-on control signal AON is at the high level.

Figure 12:
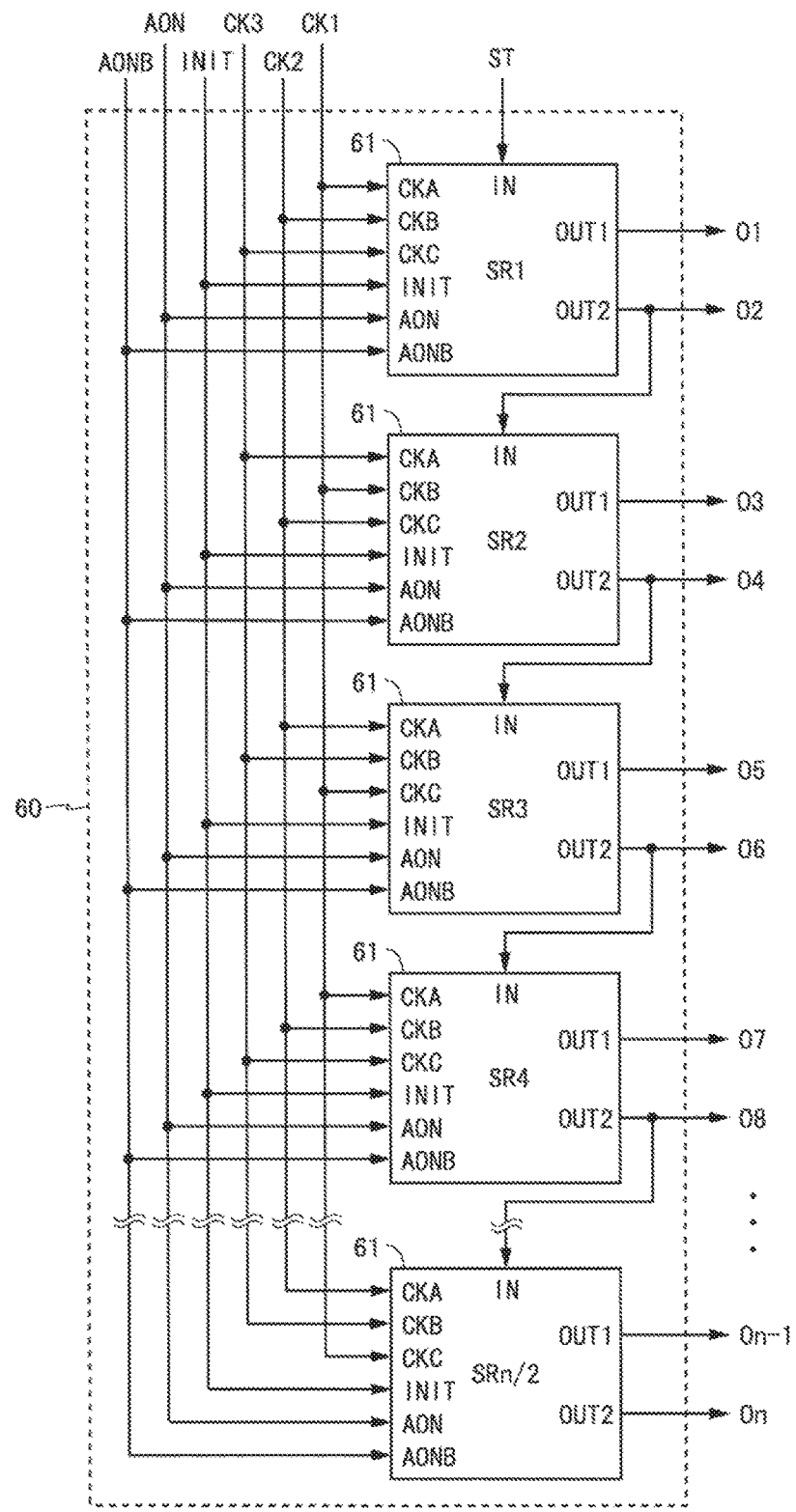
FIG. 12 is a block diagram showing a configuration of a shift register according to a first example of a sixth embodiment of the present invention.

FIG. 12 is a block diagram showing a configuration of a shift register according to a first example of the present embodiment. A shift register 60 shown in FIG. 12 has a configuration in which (n/2) unit circuits 61 are connected in multi-stage. The unit circuit 61 has the input terminal IN, clock terminals CKA, CKB, CKC, the initialization terminal INIT, the all-on control terminals AON, AONB, and output terminals OUT1, OUT2. The start signal ST, three-phase clock signals CK1 to CK3, the initialization signal INIT, the all-on control signal AON, and the negative signal AONB are supplied to the shift register 60 from the outside. The shift register 60 operates based on the three-phase clock signals and outputs two output signals from one unit circuit.

The start signal ST is supplied to the input terminal IN of the unit circuit 61 in the first stage. The initialization signal INIT, the all-on control signal AON, and the negative signal AONB are supplied to the (n/2) unit circuits 61 in the same manner as in the shift register 30 according to the third embodiment. When k is an integer not less than 1 and not more than n/3, the clock signal CK1 is supplied to the clock terminal CKA of the unit circuit 61 in a (3k−2)-th stage, the clock terminal CKB of the unit circuit 61 in a (3k−1)-th stage, and the clock terminal CKC of the unit circuit 61 in a 3k-th stage. The clock signal CK2 is supplied to the clock terminal CKB of the unit circuit 61 in the (3k−2)-th stage, the clock terminal CKC of the unit circuit 61 in the (3k−1)-th stage, and the clock terminal CKA of the unit circuit 61 in the 3k-th stage. The clock signal CK3 is supplied to the clock terminal CKC of the unit circuit 61 in the (3k−2)-th stage, the clock terminal CKA of the unit circuit 61 in the (3k−1)-th stage, and the clock terminal CKB of the unit circuit 61 in the 3k-th stage. Output signals OUT1, OUT2 of the unit circuit 61 are output to the outside as the output signals O1 to On. The output signal OUT2 is supplied to the input terminal IN of the unit circuit 61 in the next stage.

Figure 13:
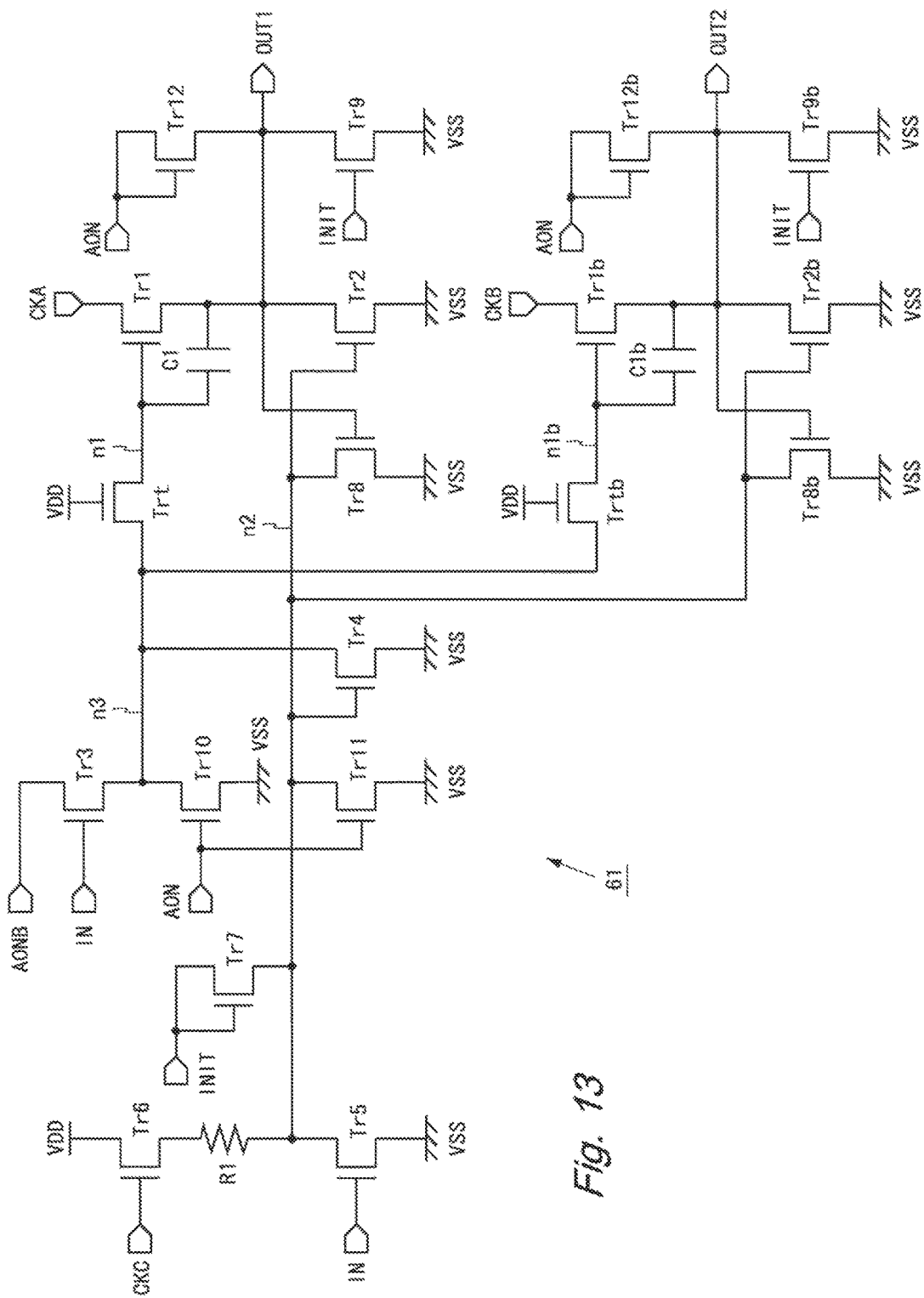
FIG. 13 is a circuit diagram of a unit circuit of the shift register shown in FIG. 12.

FIG. 13 is a circuit diagram of the unit circuit 61. The unit circuit 61 shown in FIG. 13 is obtained based on the unit circuit 41 (FIG. 9) by renaming the output terminal OUT to the output terminal OUT1, adding transistors Tr1b, Tr2b, Tr8b, Tr9b, Tr12b, Trtb and a capacitor C1b, and changing a connection point of the gate terminal of the transistor Tr6 to the clock terminal CKC. The transistors Tr1b, Tr2b, Tr8b, Tr9b, Tr12b, Trtb and the capacitor C1b are connected in a same manner as the transistors Tr1, Tr2, Tr8, Tr9, Tr12, Trt and the capacitor C1. However, a drain terminal of the transistor Tr1b is connected to the clock terminal CKB.

Figure 14:
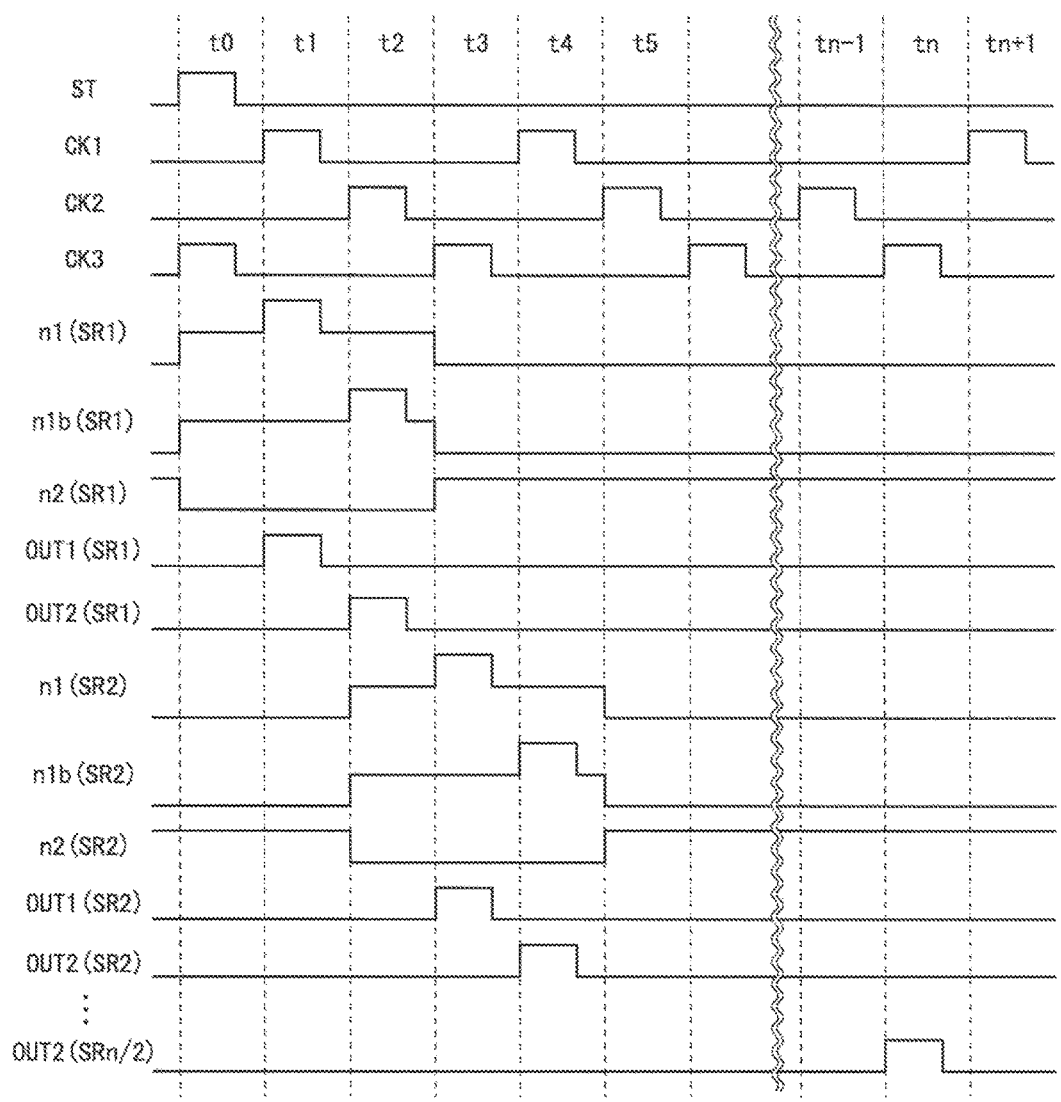
FIG. 14 is a timing chart of the shift register shown in FIG. 12.

FIG. 14 is a timing chart of the shift register 60 when performing the normal operation. As shown in FIG. 14, when performing the normal operation, the clock signal CK1 becomes the nigh level and the low level in a predetermined cycle. The high level period of the clock signal CK1 is shorter than ⅓ cycle. The clock signal CK2 is a signal obtained by delaying the clock signal CK1 by ⅓ cycle, and the clock signal CK3 is a signal obtained by delaying the clock signal CK1 by ⅔ cycle. The start signal ST becomes the nigh level in a high level period of the clock signal CK3 in a period t0.

When performing the normal operation, since the initialization signal INIT and the all-on control signal AON are at the low level, the transistors Tr7, Tr9 to Tr12, Tr9b, Tr12b turn off. Thus, these transistors do not affect the normal operation of the shift register 60. The negative signal AONB having the high level is supplied to the drain terminal of the transistor Tr3.

The normal operation of the unit circuit SR1 in the first stage will be described below. In periods t0, t1, the unit circuit SR1 operates in a manner similar to the unit circuit 11 in the first stage of the shift register 10 according to the first embodiment. In the period t0, the input signal IN (start signal ST) of the unit circuit SR1 changes to the high level. Thus, potentials of the nodes n1, n1b, n3 become (VDD−Vth), the potential of the node n2 becomes a potential close to the low-level potential VSS, and the transistors Tr1, Tr1b turn on. In the period t0, since the clock signals CKA, CKB (clock signals CK1, CK2) of the unit circuit SR1 are at the low level, the output signals OUT1, OUT2 remain at the low level. In a latter part of the period t0, the input signal IN changes to the low level. After that, the nodes n1, n1b, n3 keep the high level potential in the floating state.

In the period t1, the clock signal CKA of the unit circuit SR1 changes to the high level. At this time, the potential of the node n1 becomes higher than (VDD−Vth) by the bootstrap operation, and the potential of the output terminal OUT1 becomes equal to the high level potential VDD of the clock signal CKA. In a latter part of the period t1, the clock signal CKA changes to the low level. Thus, the output signal OUT1 becomes the low level and the potential of the node n1 returns to (VDD−Vth).

In a period t2, the clock signal CKB of the unit circuit SR1 changes to the high level. At this time, the potential of the node n1b becomes higher than (VDD−Vth) by the bootstrap operation, and the potential of the output terminal OUT2 becomes equal to the high level potential VDD of the clock signal CKB. In a latter part of the period t2, the clock signal CKB changes to the low level. Thus, the output signal OUT2 becomes the low level and the potential of the node n1b returns to (VDD−Vth).

In a period t3, the clock signal CKC (clock signal CK3) of the unit circuit SR1 changes to the high level. At this time, the potential of the node n2 becomes the high level, the potentials of the nodes n1, n1b, n3 become the low level, the transistors Tr1, Tr1b turn off, and the transistors Tr2, Tr2b turn on. The output signals OUT1, OUT2 are fixed to the low level. In a latter part of the period t3, the clock signal CKC changes to the low level. After that, the node n2 keeps the high level potential in the floating state.

The output signal OUT1 of the unit circuit SR1 becomes the high level (potential is VDD) in the high level period of the clock signal CK1 in the period t1. The output signal OUT2 of the unit circuit SR1 becomes the high level (potential is VDD) in the high level period of the clock signal CK2 in the period t2. In this manner, the unit circuit SR1 sequentially sets the two output signals OUT1, OUT2 to the high level, with delaying by ⅓ cycle of the clock signal CK1. The unit circuits SR2 to SRn/2 in the second and subsequent stages operate similarly, with delaying by ⅔ cycle of the clock signal CK1 from the unit circuit 61 in the previous stage. Therefore, the output signals O1 to On of the shift register 60 sequentially become the high level in a time having the same length as the high level period of the clock signal CK1, with delaying by ⅓ cycle of the clock signal CK1.

The shift register 60 operates in a manner similar to the shift register according to the fourth embodiment when performing the initialization or the all-on output. In the unit circuit 61, as with the unit circuit 41, even if the output signal OUT is at the high level before the initialization, when the initialization signal INIT changes to the high level, the transistors Tr9, Tr9b turn on, the output signals OUT1, OUT2 become the low level, and the transistors Tr8, Tr8b turn off. Since the transistor Tr7 turns on at this time, the potential of the node n2 becomes the high level. Therefore, according to the shift register 60, the initialization can be performed certainly.

Figure 15:
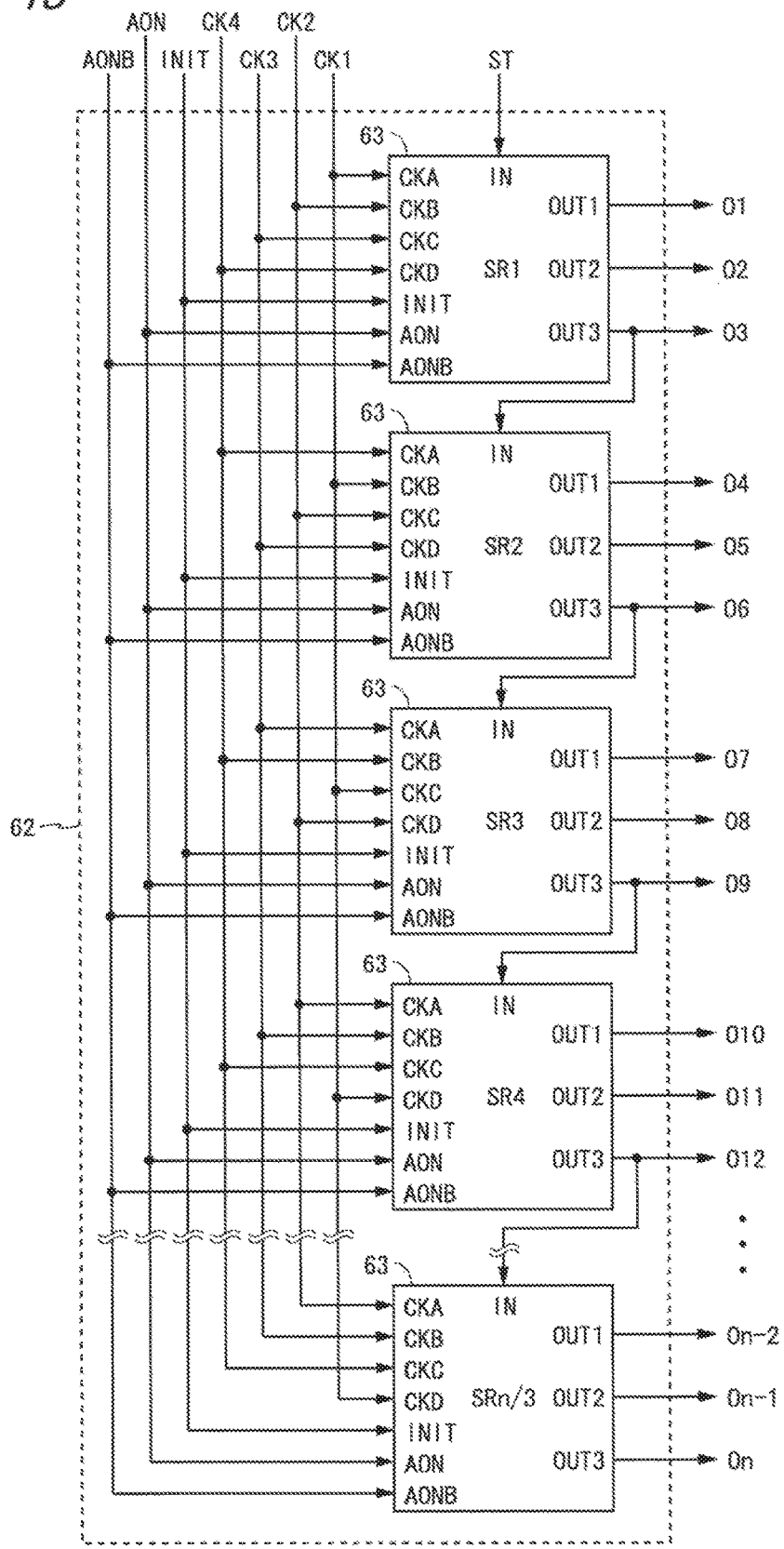
FIG. 15 is a block diagram showing a configuration of a shift register according to a second example of the sixth embodiment.

FIG. 15 is a block diagram showing a configuration of a shift register according to a second example of the present embodiment. A shift register 62 shown in FIG. 15 has a configuration in which (n/3) unit circuits 63 are connected in multi-stage. The unit circuit 63 has the input terminal IN, clock terminals CKA, CKB, CKC, CKD, the initialization terminal INIT, the all-on control terminals AON, AONB, and output terminals OUT1 to OUT3. The start signal ST, four-phase clock signals CK1 to CK4, the initialization signal INIT, the all-on control signal AON, and the negative signal AONB are supplied to the shift register 62 from the outside. The shift register 62 operates based on the four-phase clock signals and outputs three output signals from one unit circuit.

The start signal ST is supplied to the input terminal IN of the unit circuit 63 in the first stage. The initialization signal INIT, the all-on control signal AON, and the negative signal AONB are supplied to the (n/3) unit circuits 63 in the same manner as in the shift register 30 according to the third embodiment. When k is an integer not less than 1 and not more than n/4, the clock signal CK1 is supplied to the clock terminal CKA of the unit circuit 63 in a (4k−3)-th stage, the clock terminal CKB of the unit circuit 63 in a (4k−2)-th stage, the clock terminal CKC of the unit circuit 63 in a (4k−1)-th stage, and the clock terminal CKD of the unit circuit 63 in a 4k-th stage. The clock signal CK2 is supplied to the clock terminal CKB of the unit circuit 63 in the (4k−3)-th stage, the clock terminal CKC of the unit circuit 63 in the (4k−2)-th stage, the clock terminal CKD of the unit circuit 63 in the (4k−1)-th stage, and the clock terminal CKA of the unit circuit 63 in the 4k-th stage. The clock signal CK3 is supplied to the clock terminal CKC of the unit circuit 63 in the (4k−3)-th stage, the clock terminal CKD of the unit circuit 63 in the (4k−2)-th stage, the clock terminal CKA of the unit circuit 63 in the (4k−1)-th stage, and the clock terminal CKB of the unit circuit 63 in the 4k-th stage. The clock signal CK4 is supplied to the clock terminal CKD of the unit circuit 63 in the (4k−3)-th stage, the clock terminal CKA of the unit circuit 63 in the (4k−2)-th stage, the clock terminal CKB of the unit circuit 63 in the (4k−1)-th stage, and the clock terminal CKC of the unit circuit 63 in the 4k-th stage. Output signals OUT1 to OUT3 of the unit circuit 63 are output to the outside as the output signals O1 to On. The output signal OUT3 is supplied to the input terminal IN of the unit circuit 63 in the next stage.

Figure 16:
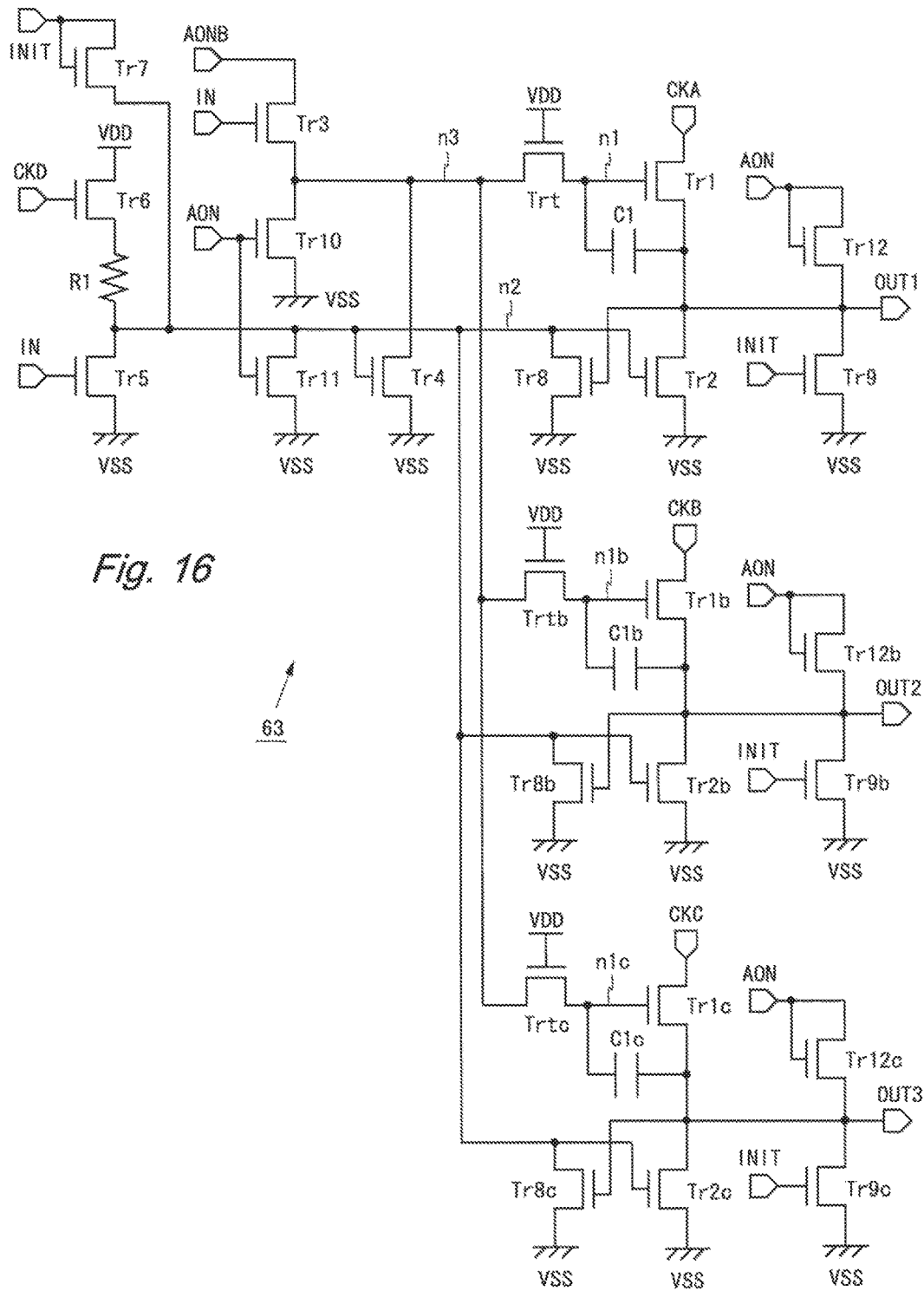
FIG. 16 is a circuit diagram of a unit circuit of the shift register shown in FIG. 15.

FIG. 16 is a circuit diagram of the unit circuit 63. The unit circuit 63 shown in FIG. 16 is obtained based on the unit circuit 61 by adding transistors Tr1c, Tr2c, Tr8c, Tr9c, Tr12c, Trtc and a capacitor Clc, and changing a connection point of the gate terminal of the transistor Tr6 to the clock terminal CKD. The transistors Tr1c, Tr2c, Tr8c, Tr9c, Tr12c, Trtc and the capacitor Clc are connected in the same manner as the transistors Tr1, Tr2, Tr8, Tr9, Tr12, Trt and the capacitor C1. However, a drain terminal of the transistor Tr1c is connected to the clock terminal CKC.

Figure 17:
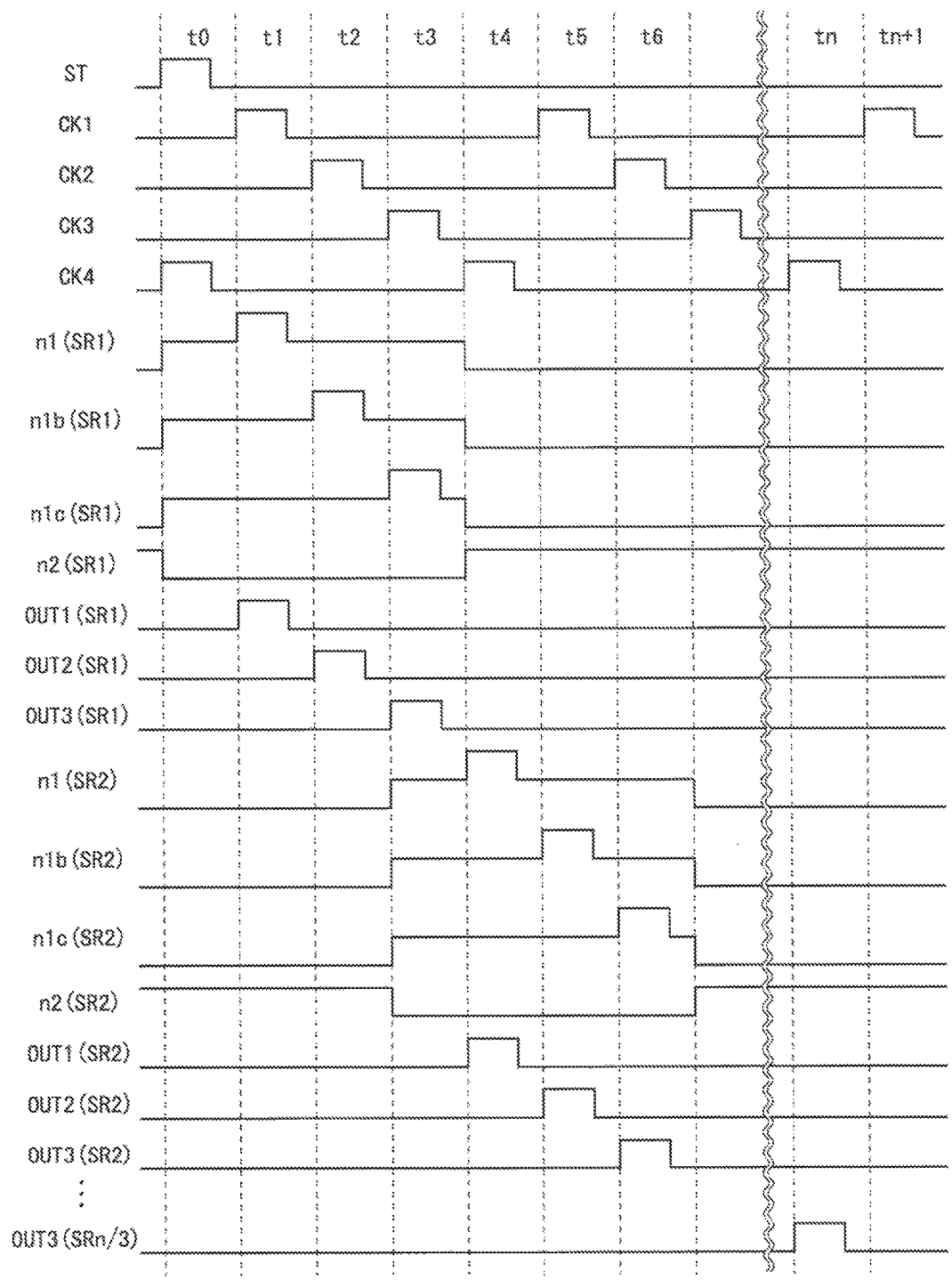
FIG. 17 is a timing chart of the shift register shown in FIG. 15.

FIG. 17 is a timing chart of the shift register 62 when performing the normal operation. As shown in FIG. 17, when performing the normal operation, the clock signal CK1 becomes the high level and the low level in a predetermined cycle. The high level period of the clock signal CK1 is shorter than ¼ cycle. The clock signal CK2 is a signal obtained by delaying the clock signal CK1 by ¼ cycle, the clock signal CK3 is a signal obtained by delaying the clock signal CK1 by ½ cycle, and the clock signal CK4 is a signal obtained by delaying the clock signal CK1 by ¾ cycle. The start signal ST becomes the high level in a high level period of the clock signal CK4 in a period t0.

When performing the normal operation, since the initialization signal INIT and the all-on control signal AON are at the low level, the transistors Tr7, Tr9 to Tr12, Tr9b, Tr12b, Tr9c, Tr12c turn off. Thus, these transistors do not affect the normal operation of the shift register 62. The negative signal AONB having the high level is supplied to the drain terminal of the transistor Tr3.

The shift register 62 operates in a manner similar to the shift register 60, when performing the normal operation. The output signal OUT1 of the unit circuit SR1 becomes the high level (potential is VDD) in the high level period of the clock signal CK1 in a period t1. The output signal OUT2 of the unit circuit SR1 becomes the high level (potential is VDD) in the high level period of the clock signal CK2 in a period t2. The output signal OUT3 of the unit circuit SR1 becomes the high level (potential is VDD) in the high level period of the clock signal CK3 in a period t3. In this manner, the unit circuit SR1 in the first stage sequentially sets the three output signals OUT1 to OUT3 to the high level, with delaying by ¼ cycle of the clock signal CK1. The unit circuits SR2 to SRn/3 in the second and subsequent stages operate similarly, with delaying by ¾ cycle of the clock signal CK1 from the unit circuit 63 in the previous stage. Therefore, the output signals O1 to On of the shift register 62 sequentially become the high level in a time having the same length as the nigh level period of the clock signal CK1, with delaying by ¼ cycle of the clock signal CK1.

The shift register 62 operates in a manner similar to the shift register according to the fourth embodiment when performing the initialization or the all-on output. In the unit circuit 63, as with the unit circuit 41, even if the output signal OUT is at the high level before the initialization, when the initialization signal INIT changes to the high level, the transistors Tr9, Tr9b, Tr9c turn on, the output signals OUT1 to OUT3 become the low level, and the transistors Tr8, Tr8b, Tr8c turn off. Since the transistor Tr7 turns on at this time, the potential of the node n2 becomes the high level. Therefore, according to the shift register 62, the initialization can be performed certainly.

Figure 18:
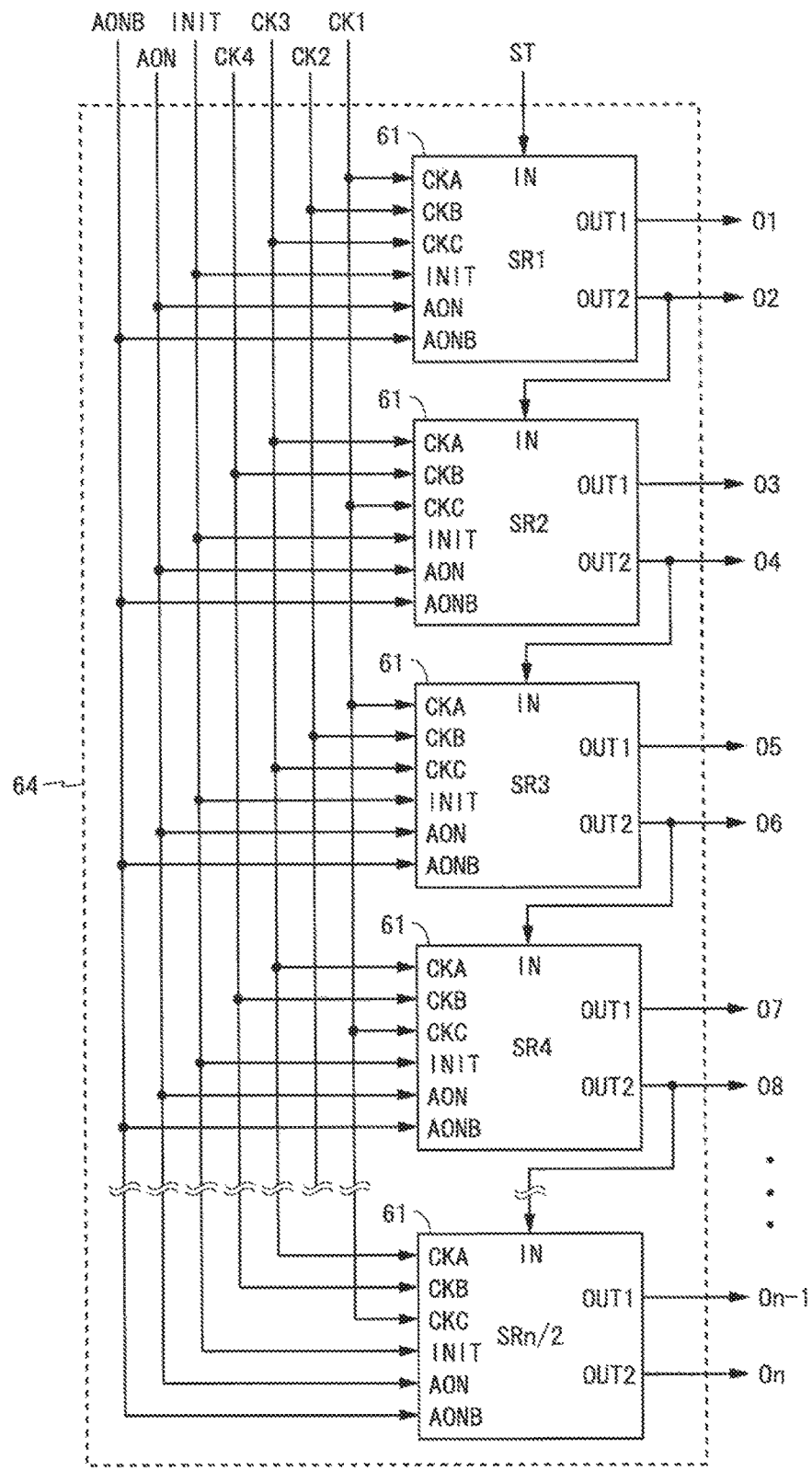
FIG. 18 is a block diagram showing a configuration of a shift register according to a third example of the sixth embodiment.

FIG. 18 is a block diagram, showing a configuration of a shift register according to a third example of the present embodiment. A shift register 64 shown in FIG. 18 has a configuration, in which (n/2) pieces of the unit circuits 61 are connected in multi-stage. The start signal ST, the four-phase clock signals CK1 to CK4, the initialization signal INIT, the all-on control signal AON, and the negative signal AONB are supplied to the shift register 64 from the outside. The shift register 64 operates based on the four-phase clock signals and outputs two output signals from one unit circuit.

The start signal ST is supplied to the input terminal IN of the unit circuit 61 in the first stage. The initialization signal INIT, the all-on control signal AON, and the negative signal AONB are supplied to the (n/2) unit circuits 61 in the same manner as in the shift register 30 according to the third embodiment. The clock signal CK1 is supplied to the clock terminal CKA of the unit circuit 61 in the odd-numbered stage and the clock terminal CKC of the unit circuit 61 in the even-numbered stage. The clock signal CK2 is supplied to the clock terminal CKB of the unit circuit 61 in the odd-numbered stage. The clock signal CK3 is supplied to the clock terminal CKC of the unit circuit 61 in the odd-numbered stage and the clock terminal CKA of the unit circuit 61 in the even-numbered stage. The clock signal CK4 is supplied to the clock terminal CKB of the unit circuit 61 in the even-numbered stage. The output signals OUT1, OUT2 of the unit circuit 61 are output to the outside as the output signals O1 to On. The output signal OUT2 is supplied to the input terminal IN of the unit circuit 61 in the next stage.

Figure 19:
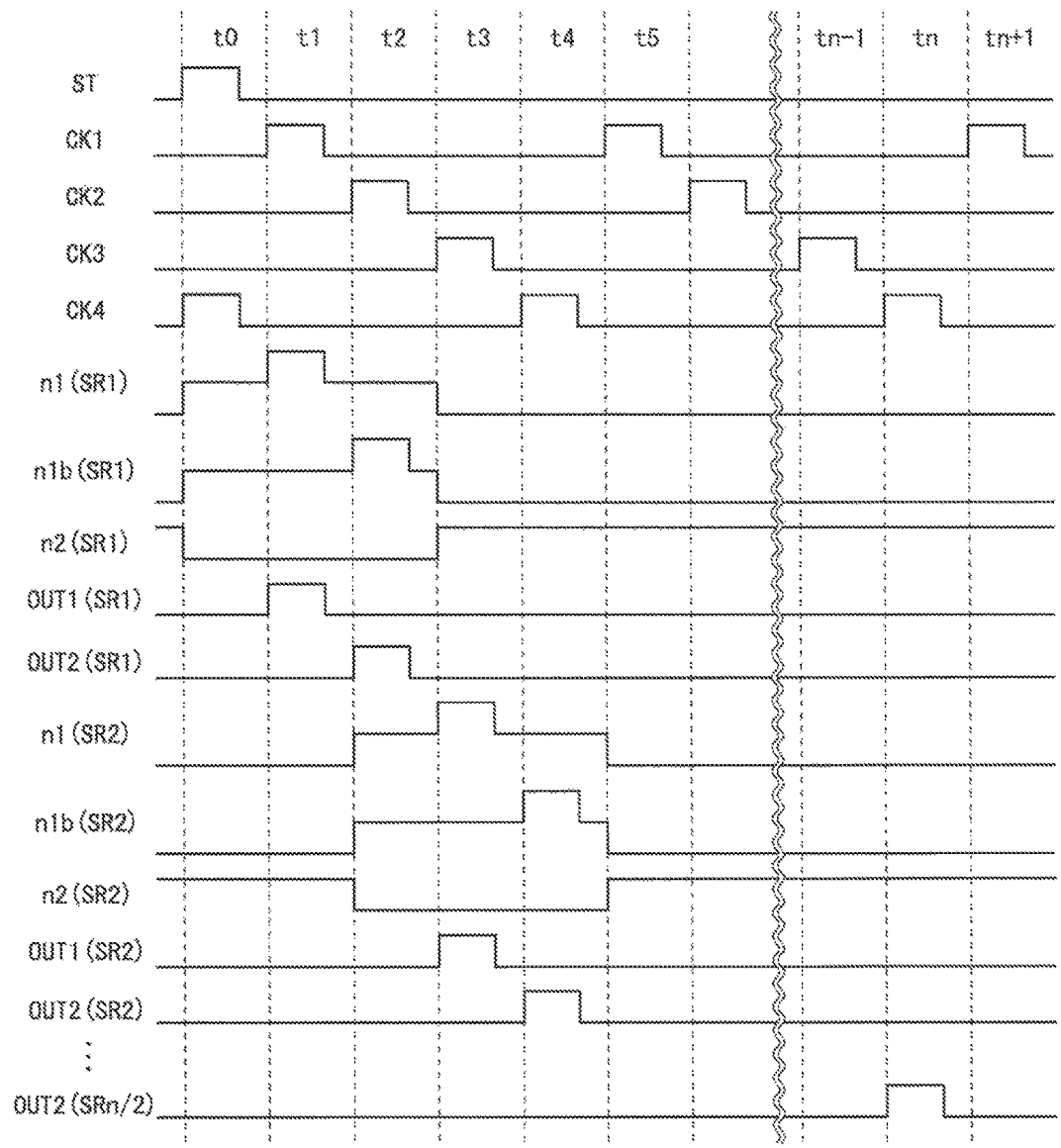
FIG. 19 is a timing chart of the shift register shown in FIG. 18.

FIG. 19 is a timing chart of the shift register 64 when performing the normal operation. As shown in FIG. 19, the start signal ST and the clock signals CK1 to CK4 change in a manner similar to those in the shift register 62. The shift register 64 operates in a manner similar to the shift registers 60, 62 when performing the normal operation. The output signal OUT1 of the unit circuit SR1 becomes the high level (potential is VDD) in the high level period of the clock signal CK1 in a period t1. The output signal OUT2 of the unit circuit SR1 becomes the high level (potential is VDD) in the high level period of the clock signal CK2 in a period t2. In this manner, the unit circuit SR1 in the first stage sequentially sets the two output signals OUT1, OUT2 to the high level, with delaying by ¼ cycle of the clock signal CK1. The unit circuits SR2 to SRn/2 in the second and subsequent stages operate similarly, with delaying by ½ cycle of the clock signal CK1 from the unit circuit 61 in the previous stage. Therefore, the output signals O1 to On of the shift register 64 sequentially become the high level in a time having the same length as the high level period of the clock signal CK1, with delaying by ¼ cycle of the clock signal CK1.

The shift register 64 operates in a manner similar to the shift register according to the fourth embodiment when performing the initialization or the all-on output. According to the shift register 64, the initialization can be performed certainly for a reason similar to those for the shift registers 60, 62.

Figure 20:
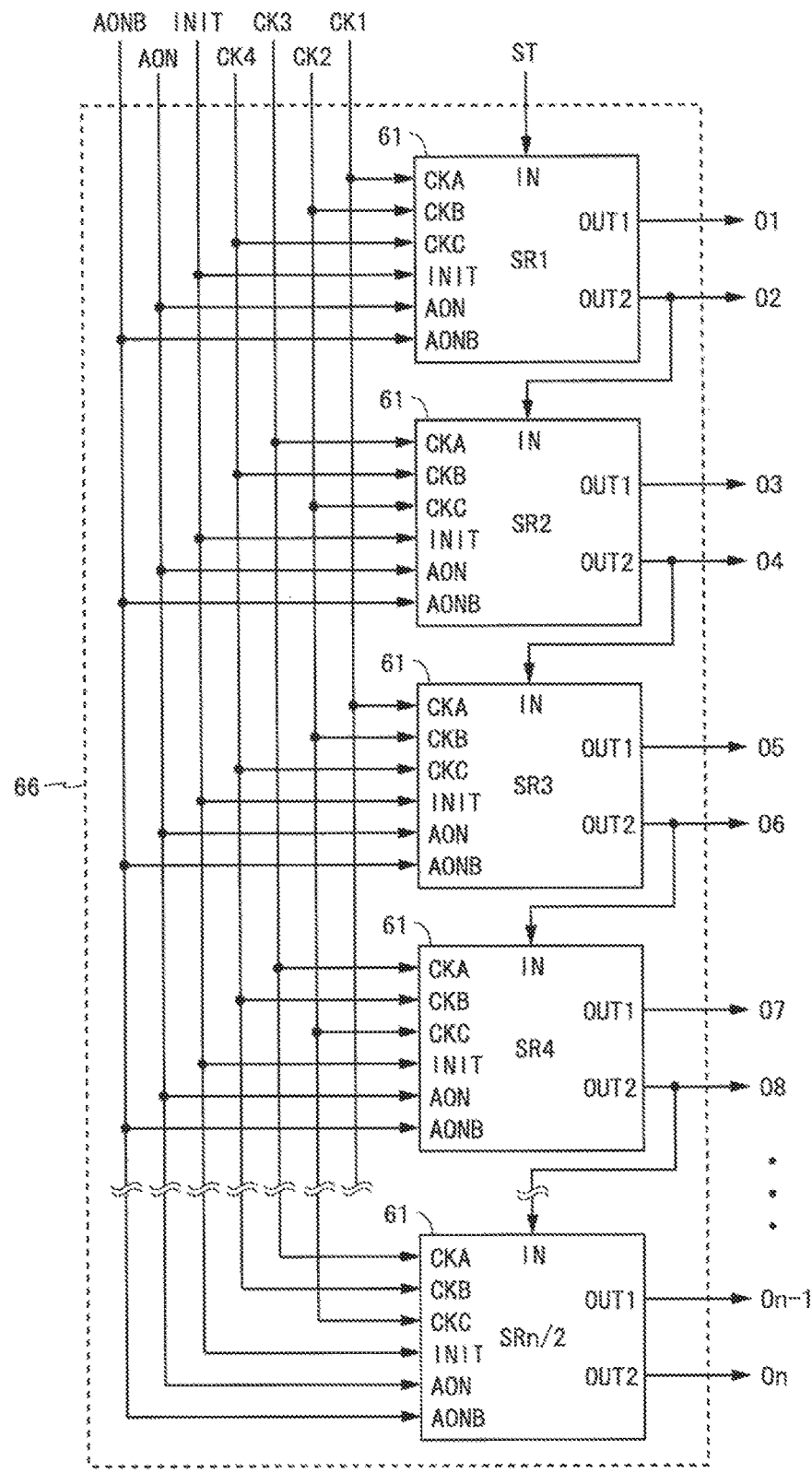
FIG. 20 is a block diagram showing a configuration of a shift register according to a fourth example of the sixth embodiment.

FIG. 20 is a block diagram showing a configuration of a shift register according to a fourth example of the present embodiment. A shift register 66 shown in FIG. 20 has a configuration in which (n/2) pieces of the unit circuits 61 are connected in multi-stage. The start signal ST, the four-phase clock signals CK1 to CK4, the initialization signal INIT, the all-on control signal AON, and the negative signal AONB are supplied to the shift register 66 from the outside. The shift register 66 operates based on the four-phase clock signals and outputs two output signals from one unit circuit.

The start signal ST is supplied to the input terminal IN of the unit circuit 61 in the first stage. The initialization signal INIT, the all-on control signal AON, and the negative signal AONB are supplied to the (n/2) unit circuits 61 in the same manner as in the shift register 30 according to the third embodiment. The clock signal CK1 is supplied to the clock terminal CKA of the unit circuit 61 in the odd-numbered stage. The clock signal CK2 is supplied to the clock terminal CKB of the unit circuit 61 in the odd-numbered stage and the clock terminal CKC of the unit circuit 61 in the even-numbered stage. The clock signal CK3 is supplied to the clock terminal CKA of the unit circuit 61 in the even-numbered stage. The clock signal CK4 is supplied to the clock terminal CKC of the unit circuit 61 in the odd-numbered stage and the clock terminal CKB of the unit circuit 61 in the even-numbered stage. The output signals OUT1, OUT2 of the unit circuit 61 are output to the outside as the output signals O1 to On. The output signal OUT2 is supplied to the input terminal IN of the unit circuit 61 in the next stage.

Figure 21:
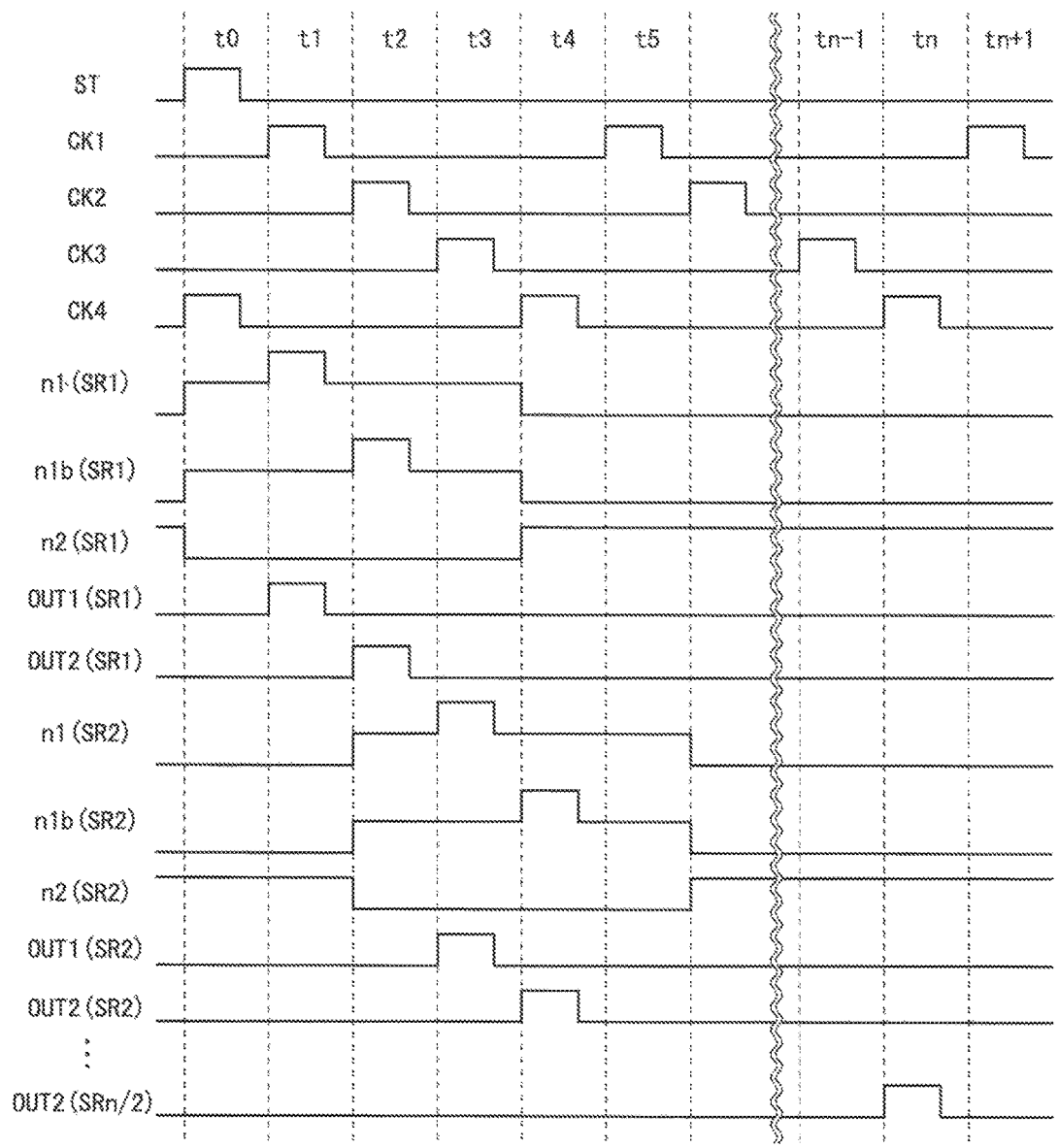
FIG. 21 is a timing chart of the shift register shown in FIG. 20.

FIG. 21 is a timing chart of the shift register 6 6 when performing the normal operation. As shown in FIG. 21, the start signal ST and the clock signals CK1 to CK4 change in a manner similar to those in the shift registers 62, 64. The shift register 66 operates in a manner similar to the shift registers 60, 62, 64 when performing the normal operation. The output signal OUT1 of the unit circuit SR1 becomes the high level (potential is VDD) in the high level period of the clock signal CK1 in a period t1. The output signal OUT2 of the unit circuit SR1 becomes the high level (potential is VDD) in the high level period of the clock signal CK2 in a period t2. In this manner, the unit circuit SR1 in the first stage sequentially sets the two output signals OUT1, OUT2 to the high level, with delaying by ¼ cycle of the clock signal CK1. The unit circuits SR2 to SRn/2 in the second and subsequent stages operate similarly, with delaying by ½ cycle of the clock signal CK1 from the unit circuit 61 in the previous stage. Therefore, the output signals O1 to On of the shift register 66 sequentially become the high level in a time having the same length as the high level period of the clock signal CK1, with delaying by ¼ cycle of the clock signal CK1. Note that in the shift register 66, compared with the shift register 64, a period in which the potentials of the nodes n1, n1b are at the high level and the potential of the node n2 is at the low level is longer by ¼ cycle of the clock signal CK1, The shift register 66 operates in a manner similar to the shift register according to the fourth embodiment when performing the initialization or the all-on output. According to the shift register 66, the initialization can be performed certainly for a reason similar to those for the shift registers 60, 62, 64.

As described above, in the shift registers 60, 62, 64, 66 according to the present embodiment, each of the unit circuits 61, 63 includes a plurality of output transistors, a plurality of output reset transistors, a plurality of node stabilization transistors, and a plurality of output initialization transistors (transistors Tr1, Tr2, Tr8, Tr9). Therefore, circuit amount of the shift register can be reduced by outputting a plurality of signals from one unit circuit, As for the shift registers 60, 62, 64, 66 according to the present embodiment, the first to seventh variants described above can be configured. In the first variant, a unit circuit obtained by deleting the capacitors C1, C1b from the unit circuit 61, or a unit circuit obtained by deleting the capacitors C1, C1b, C1c from the unit circuit 63 is used. In the second variant, a unit circuit obtained by deleting either or both of the transistors Trt, Trtb from the unit circuit 61, or a unit circuit obtained by deleting at least one of the transistors Trt, Trtb, Trtc from the unit circuit 63 is used. In the sixth variant, a unit circuit obtained based on the unit circuit 61 by applying the high level potential VDD to the drain terminals of the transistors Tr7, Tr12, Tr12b, or a unit circuit obtained based on the unit circuit 63 by applying the high level potential VDD to the drain terminals of the transistors Tr7, Tr12, Tr12b, Tr12c is used.

Furthermore, as an eighth variant, a shift register for outputting a plurality of output signals from one unit circuit may be configured using a unit circuit other than the unit circuit 41. Furthermore, as a ninth variant, a shift register for operating based on five or more phase clock signals and outputting a plurality of output signals from one unit circuit may be configured using a method similar as described above. It is necessary to provide the resistor R1 between the transistor Tr6 and the node n2 to a unit circuit in which the transistors Tr5, Tr6 turn on together, such as the unit circuit 61 of the shift registers 60, 66 or the unit circuit 63 of the shift register 62. In contrast, it is not necessary to provide the resistor R1 to a unit circuit in which the transistors Tr5, Tr6 do not turn on together, such as the unit circuit 61 of the shift register 64.

(Seventh Embodiment)

Figure 22:
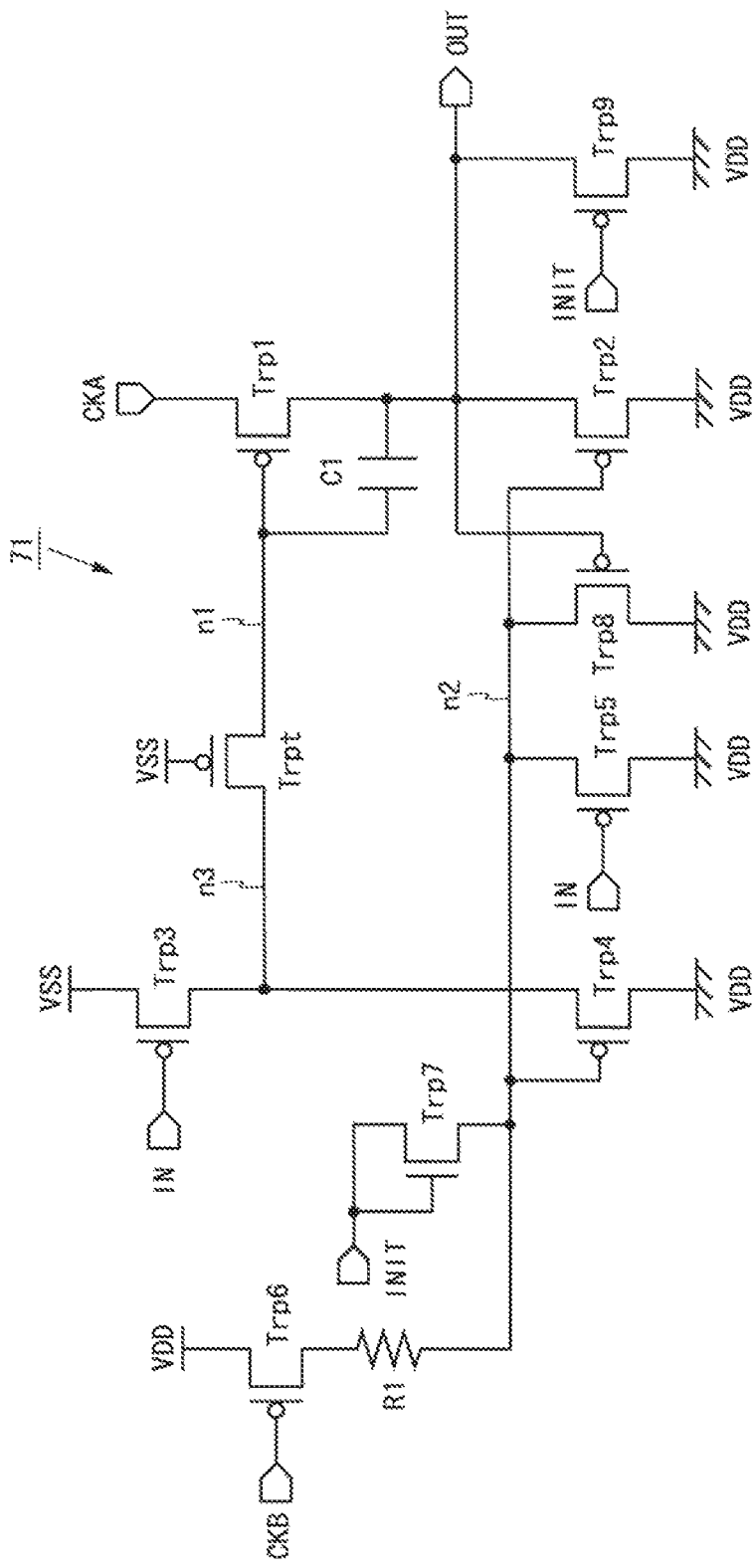
FIG. 22 is a circuit diagram of a unit circuit of a shift register according to a seventh embodiment of the present invention.

A shift register according to a seventh embodiment of the present invention has the configuration shown in FIG. 1. However, the shift register according to the present embodiment includes a unit circuit 71 shown in FIG. 22 in place of the unit circuit 11. The unit circuit 71 is obtained by configuring the unit circuit 11 using P-channel type transistors. The unit circuit 71 includes ten P-channel type transistors Trp1 to Trp9, Trpt, the capacitor C1, and the resistor R1.

Figure 23:
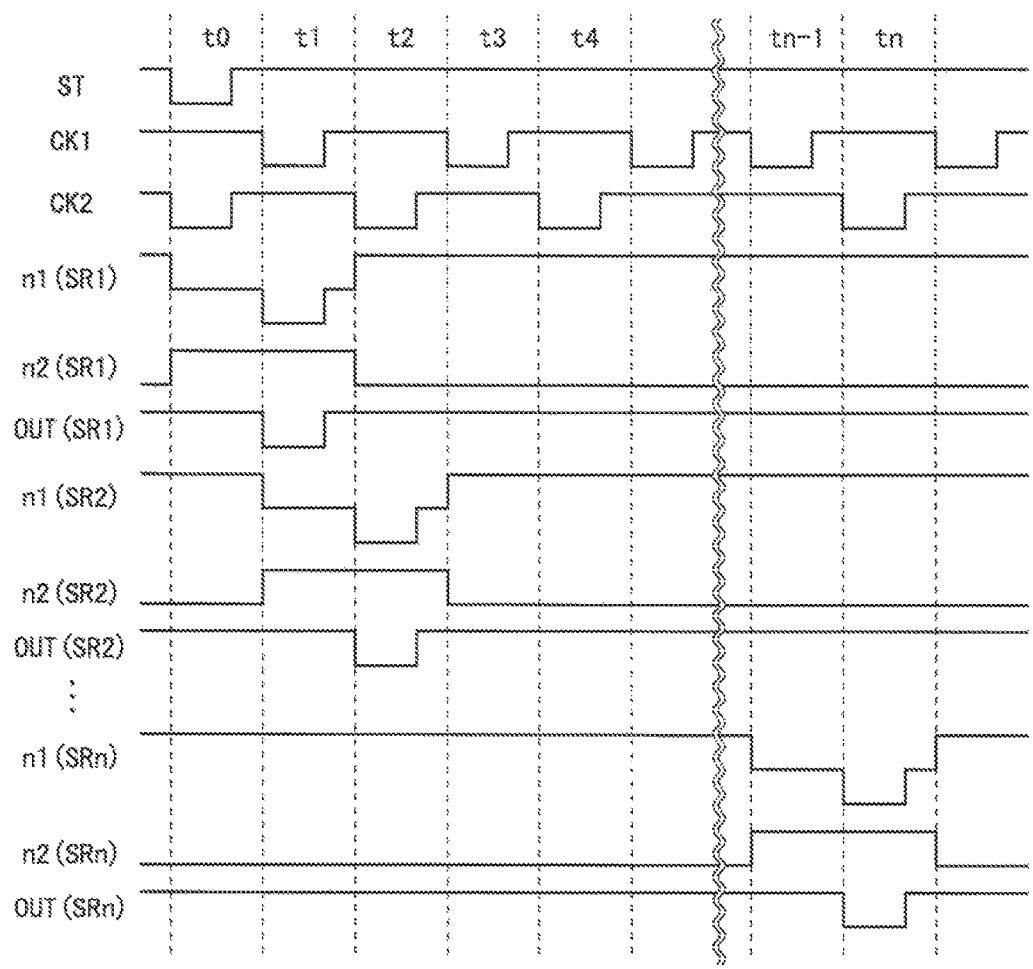
FIG. 23 is a timing chart of the shift register according to the seventh embodiment.

In general, in order to configure, using P-channel type transistors, a circuit configured using N-channel type transistors, the N-channel type transistors are replaced with the P-channel type transistors, a polarity of a power supply is reversed (exchange the high level potential VDD with the low level potential VSS), and polarities of input signals are reversed (exchange high level with low level). FIG. 23 is a timing chart of the shift register according to the present embodiment. The timing chart shown in FIG. 23 is obtained based on the timing chart shown in FIG. 3 by reversing polarities of potentials of signals and nodes.

According to the shift register according to the present embodiment, the initialization can be performed certainly for the shift register configured using the P-channel type transistors. Here, as an example, there is described a case in which the unit circuit 11 according to the first embodiment is configured using the P-channel type transistors. A similar method can be applied to the unit circuits according to the second to sixth embodiments.

(Eighth Embodiment)

Figure 24:
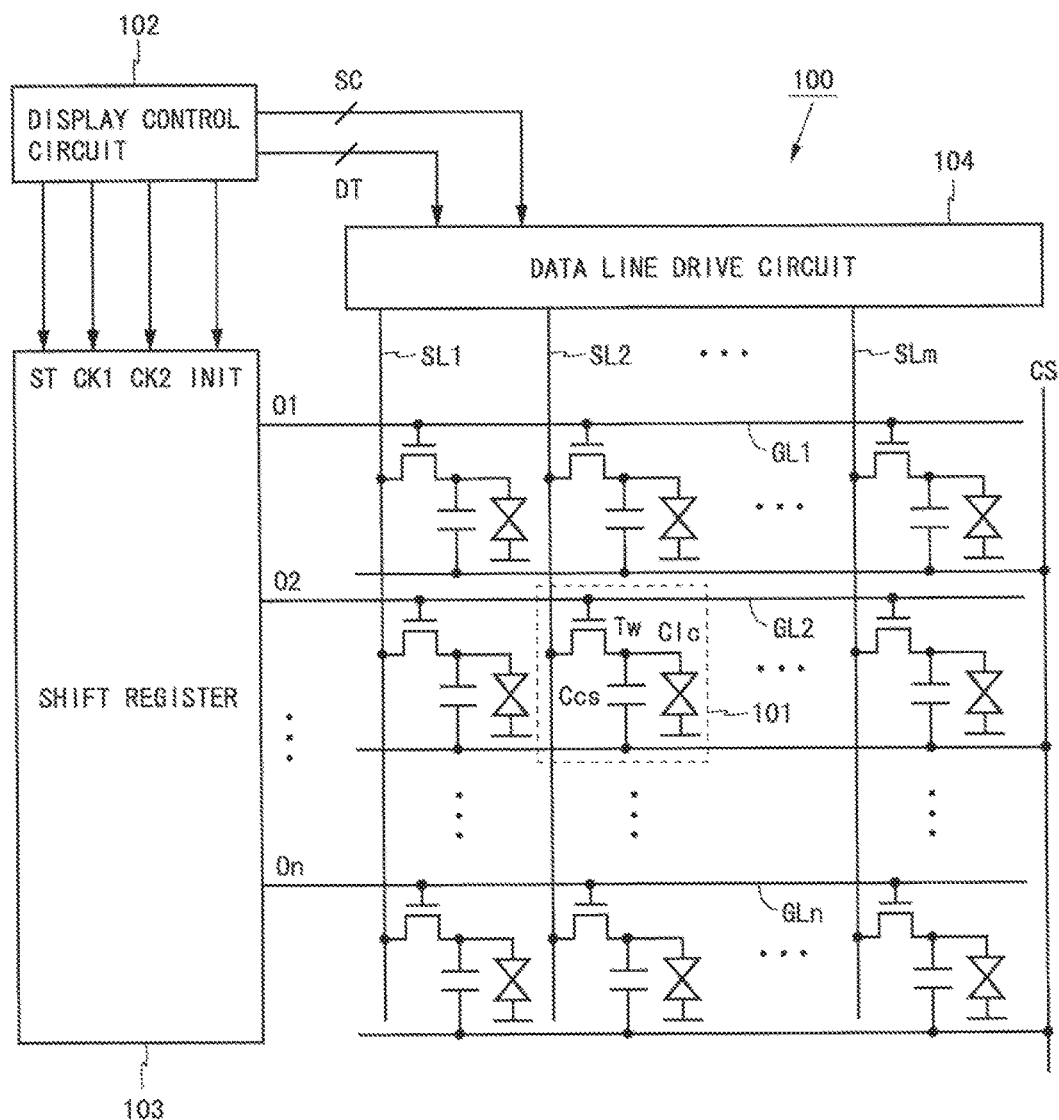
FIG. 24 is a block diagram showing a configuration of a liquid crystal display device according to an eighth embodiment of the present invention.

In an eighth embodiment, examples of display devices including a shift register will be described. FIG. 24 is a block diagram showing a configuration of a liquid crystal display device according to the present embodiment. A liquid crystal display device 100 shown in FIG. 24 includes n scanning lines GL1 to GLn, m (m is an integer not less than 2) data lines SL1 to SLm, (m×n) pixel circuits 101, a display control circuit 102, a shift register 103, and a data line drive circuit 104. The shift register 103 functions as a scanning line drive circuit. One of the shift registers described above is used as the shift register 103. The shift register 10 according to the first embodiment is used in FIG. 24.

The scanning lines GL1 to GLn are arranged in parallel to each other, and the data lines SL1 to SLm are arranged in parallel to each other so as to intersect with the scanning lines GL1 to GLn perpendicularly. The (m×n) pixel circuits 101 are arranged corresponding to intersections of the scanning lines GL1 to GLn and the data lines SL1 to SLm. The pixel circuit 101 includes an K-channel type transistor Tw (write control transistor), a liquid crystal capacitance Clc, and an auxiliary capacitance Ccs. A gate terminal of the transistor Tw is connected to one scanning line, and a source terminal of the transistor Tw is connected to one data line. A drain terminal of the transistor Tw is connected to one ends of the liquid crystal capacitance Clc and the auxiliary capacitance Ccs. The other end of the auxiliary capacitance Ccs is connected to an auxiliary capacitance line CS.

Hereinafter, an arrangement area of the pixel circuits 101 is referred to as display area. The shift register 103 is arranged along one side (left side in FIG. 24) of the display area. The data line drive circuit 104 is arranged along another side (upper side in FIG. 24) of the display area. The display control circuit 102 supplies the start signal ST, the two-phase clock signals CK1, CK2, and the initialization signal INIT to the shift register 103, and supplies a control signal SC and a data signal DT to the data line drive circuit 104.

The output terminals O1 to On of the shift register 103 are connected to one ends (left ends in FIG. 24) of the scanning lines GL1 to GLn, respectively. The shift register 103 selectively performs the initialization and the normal operation in accordance with the initialization signal INIT. When performing the normal operation, the shift register 103 drives the scanning lines GL1 to GLn based on the start signal ST and the two-phase clock signals CK1, CK2. The data line drive circuit 104 drives the data lines SL1 to SLm based on the control signal SC and the data signal DT.

Figure 25:
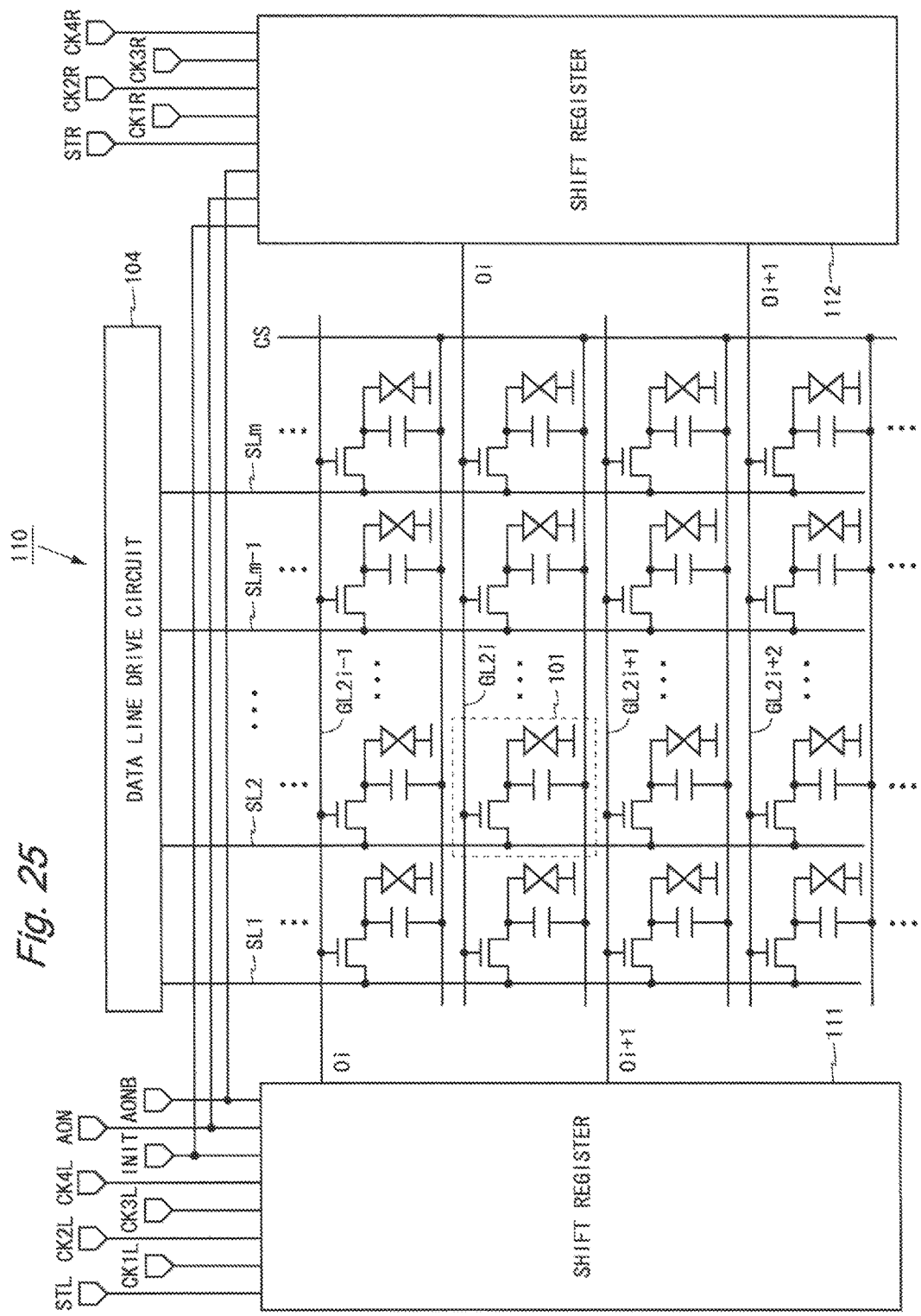
FIG. 25 is a block diagram showing another configuration of the liquid crystal display device according to the eighth embodiment.

FIG. 25 is a block diagram showing another configuration of the liquid crystal display device according to the present embodiment. A liquid crystal display device 110 shown in FIG. 25 includes 2n scanning lines GL1 to GL2n, the m data lines SL1 to SLm, (m×2n) pieces of the pixel circuits 101, a display control circuit (not shown), shift registers 111, 112, and the data line drive circuit 104, The scanning lines GL1 to GL2n, the data lines SL1 to SLm, the (m×2n) pixel circuits 101, and the data line drive circuit 104 are arranged in a same manner as in the liquid crystal display device 100. The shift registers 111, 112 function as scanning line drive circuits. The shift register 64 according to the third example of the sixth embodiment is used as the shift registers 111, 112.

The shift register 111 is arranged along one side (left side in FIG. 25) of the display area, and the shift register 112 is arranged along the opposite side (right side in FIG. 25) of the display area. Each of the shift registers 111, 112 has the n output terminals O1 to On. An i-th (i is an integer not less than 1 and not more than n) output terminal Oi of the shift register 111 is connected to one end (left end in FIG. 25) of an odd-numbered scanning line GL2i-1. The shift register 111 drives the odd-numbered scanning line GL2i-1 from one end side. The i-th output terminal Oi of the shift register 112 is connected to the other end (right end in FIG. 25) of an even-numbered scanning line GL2i. The shift register 112 drives the even-numbered scanning line GL2i from other end side. In this manner, in the liquid crystal display device 110, the odd-numbered scanning line GL2i-1 is driven from the one end side using the shift register 111, and the even-numbered scanning line GL2i is driven from the other end side using the shift register 112. Such a drive method of the scanning lines may be called a comb teeth drive. On the other hand, a method in which scanning line drive circuits are respectively provided on two opposing sides of the display area, two ends of the scanning lines are respectively connected to the two scanning line drive circuits, and the scanning lines are driven from both sides may be called a double side drive.

Figure 26:
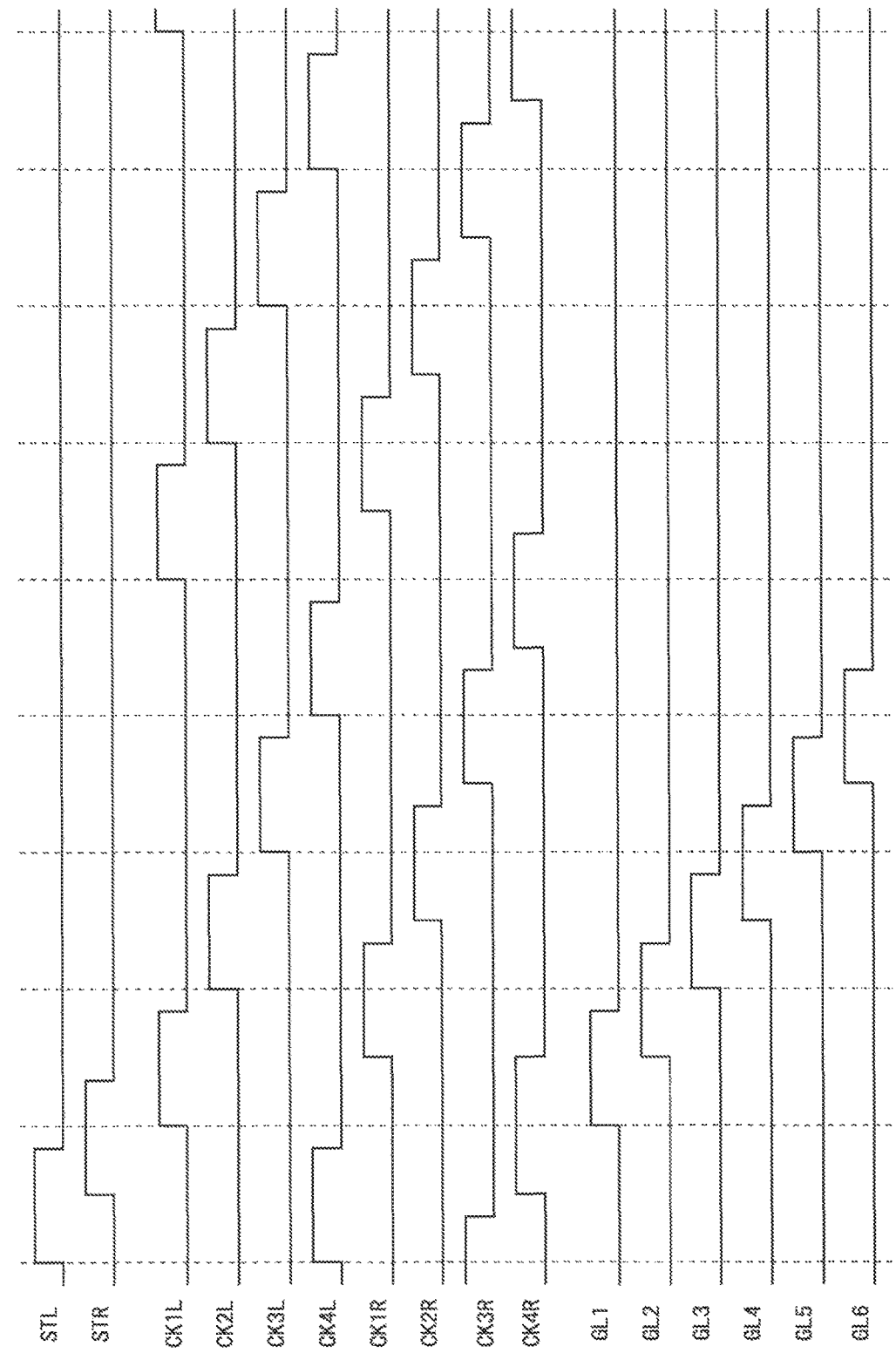
FIG. 26 is a timing chart of the liquid crystal display device shown in FIG. 25 when performing a double pulse drive.
Figure 27:
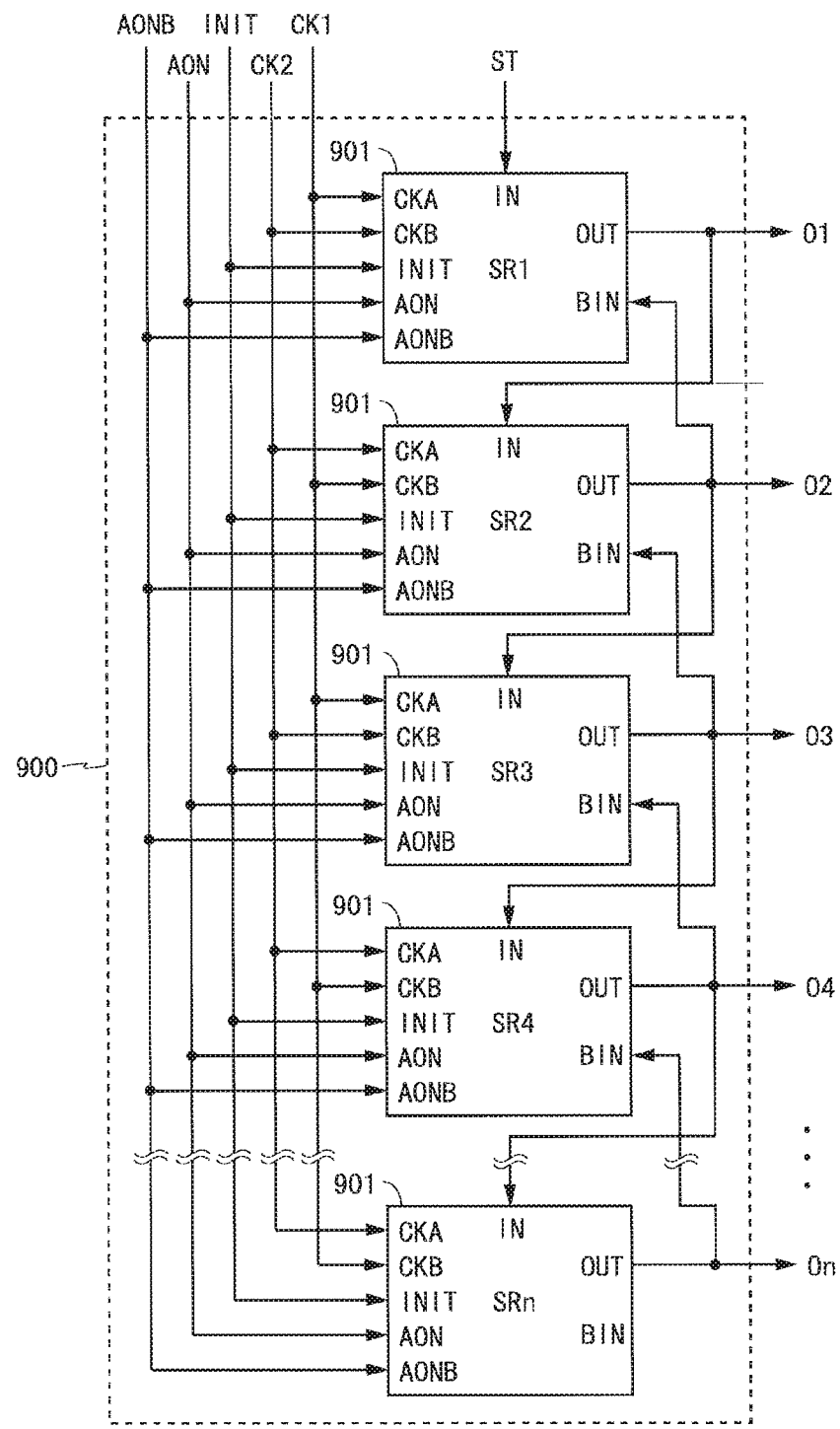
FIG. 27 is a block diagram showing a configuration of a conventional shift register.
Figure 28:
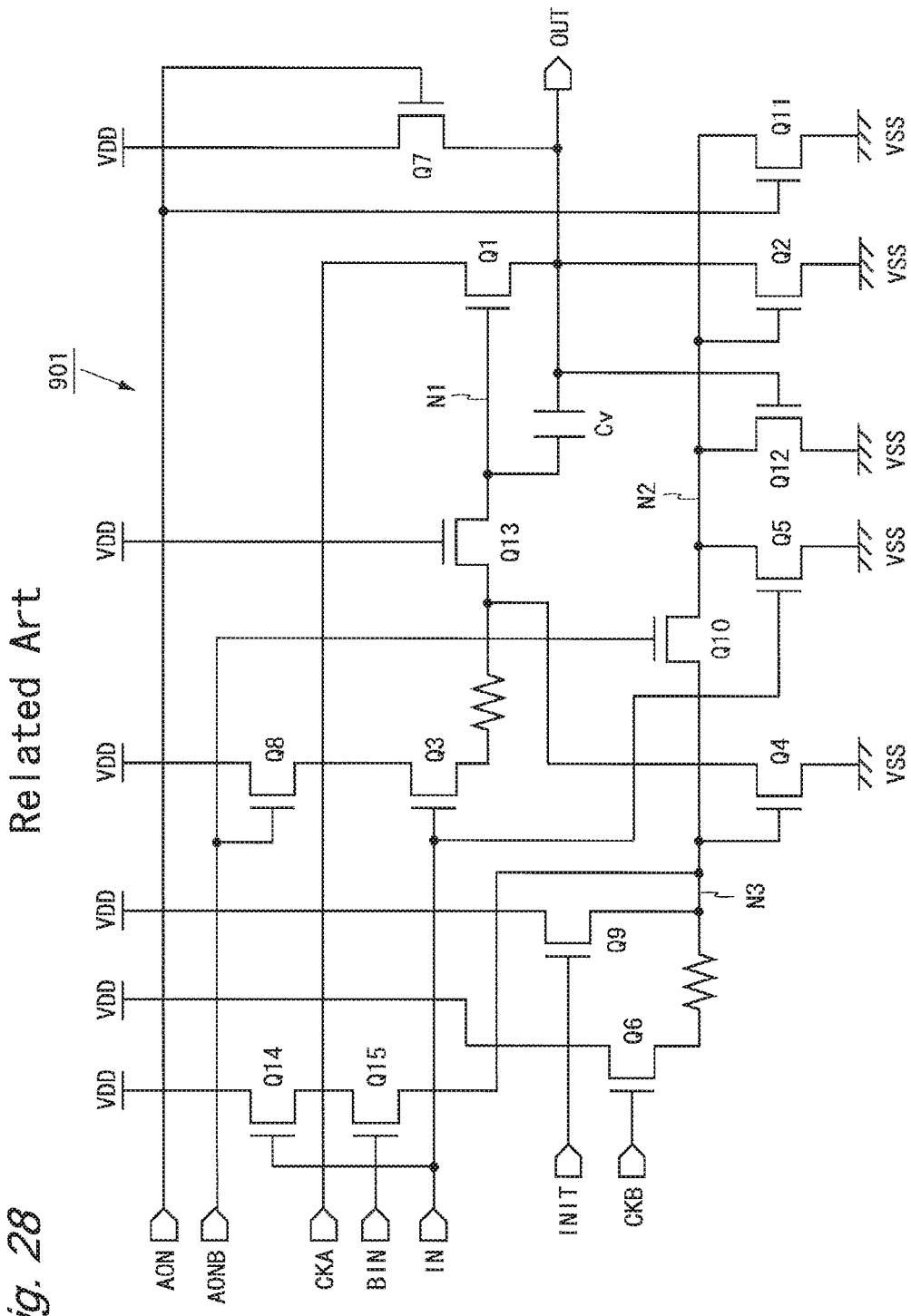
Figure 29:
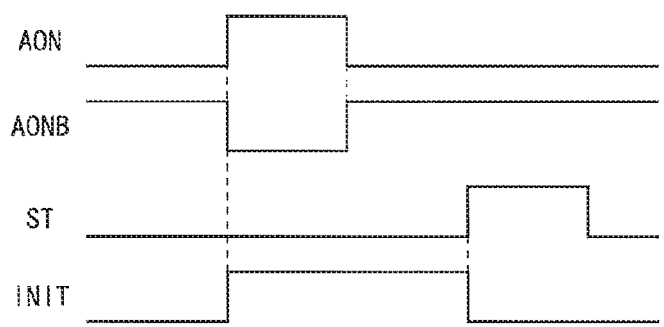
FIG. 29 is a timing chart of the conventional shift register when performing an all-on output and an initialization.

A start signal STL and four-phase clock signals CK1L to CK4L are supplied to the shift register 111, and a start signal STR and four-phase clock signals CK1R to CK4R are supplied to the shift register 112. In the liquid crystal display device 110, phases of the five signals supplied to the shift register 111 and phases of the five signals supplied to the shift register 112 may be the same, or may be different by ⅛ cycle of the clock signal. The latter drive method may be called a double pulse drive. A timing chart of the liquid crystal display device 110 when performing the double pulse drive is shown in FIG. 26.

In the display device performing the comb teeth drive, only one end of the scanning line is connected to the shift register (scanning line drive circuit). Thus, compared with the display device performing the double side drive, load of the scanning line is larger and it is more difficult to control the potential of the scanning line to be the low level. The unit circuit of the shift register according to the embodiments and the variants of the present invention include the output initialization transistor for setting the output signal to the off level when performing the initialization. Therefore, it is possible to control the output signal to be the off level in a short time using the output initialization transistor when performing the initialization, even in the display device performing the comb teeth drive or the double pulse drive.

As described above, the display device according to the present embodiment includes the plurality of the scanning lines arranged in parallel to each other, the plurality of the data lines arranged in parallel to each other so as to intersect with the scanning lines perpendicularly, the plurality of the pixel circuits arranged corresponding to intersections of the scanning lines and the data lines, and one of the shift registers described above as a scanning line drive circuit for driving the scanning lines. Therefore, a reliable display device can be configured using a shift register which can perform the initialization certainly.

As for the shift registers described above, shift registers according to various kinds of variants can be configured by arbitrarily combining features of a plurality of the unit circuits, unless contrary to the nature thereof.

INDUSTRIAL APPLICABILITY

The shift register of the present invention has a feature that a potential of a node in a unit circuit can be stabilized based on an output signal and an initialization can be performed certainly. Therefore, the shift register can be used for a drive circuit of a display device and the like.

DESCRIPTION OF REFERENCE CHARACTERS

Effects Of The Invention 10, 20, 30, 50, 60, 62, 64, 66, 103, 111, 112: SHIFT REGISTER 11, 31, 41, 51, 61, 63, 71: UNIT CIRCUIT
22: SELECTION CIRCUIT
100, 110: LIQUID CRYSTAL DISPLAY DEVICE
101: PIXEL CIRCUIT
102: DISPLAY CONTROL CIRCUIT
104: DATA LINE DRIVE CIRCUIT
Tr1, Tr1b, Tr1c: TRANSISTOR (OUTPUT TRANSISTOR)
Tr2, Tr2b, Tr2c: TRANSISTOR (OUTPUT RESET TRANSISTOR)
Tr3: TRANSISTOR (FIRST TRANSISTOR)
Tr4: TRANSISTOR (SECOND TRANSISTOR)
Tr5: TRANSISTOR (THIRD TRANSISTOR)
Tr6: TRANSISTOR (FOURTH TRANSISTOR)
Tr7: TRANSISTOR (FIFTH TRANSISTOR)
Tr8, Tr8b, Tr8c: TRANSISTOR (NODE STABILIZATION TRANSISTOR)
Tr9, Tr9b, Tr9c: TRANSISTOR (OUTPUT INITIALIZATION TRANSISTOR)
Tr10 to Tr12, Tr14, Tr15, Trt, Tr12b, Trtb, Tr12c, Trtc, Tr21, Tr22: TRANSISTOR

The invention claimed is:

1. A shift register having a configuration in which a plurality of unit circuits are connected in multi-stage, wherein
the unit circuit comprises:
an output transistor having a first conduction terminal connected to a clock terminal configured to input a clock signal, a second conduction terminal connected to an output terminal configured to output the clock signal, and a control terminal connected to a first node;
an output reset transistor having a first conduction terminal connected to the output terminal, a second conduction terminal to which an off potential is applied, and a control terminal connected to a second node; and
a node control unit configured to control potentials of the first and second nodes,
the node control unit includes a node stabilization transistor having a first conduction terminal connected to the second node, a second conduction terminal to which the off potential is applied, and a control terminal connected to the output terminal, and
the unit circuit further comprises an output initialization transistor having a first conduction terminal connected to the output terminal, a second conduction terminal to which the off potential is applied, and a control terminal to which an initialization signal that becomes an on level when performing an initialization is supplied.

2. The shift register according to claim 1, wherein
the node control unit further includes:
a first transistor configured to control the potential of the first node to be the on level in accordance with an input signal of the unit circuit;
a second transistor configured to control the potential of the first node to be an off level in accordance with the potential of the second node;
a third transistor configured to control the potential of the second node to be the off level in accordance with the input signal; and
a fourth transistor configured to control the potential of the second node to be the on level in accordance with a second clock signal of the unit circuit.

3. The shift register according to claim 2, wherein the node control unit further includes a fifth transistor configured to control the potential of the second node to be the on level in accordance with the initialization signal.

4. The shift register according to claim 3, wherein the off potential is fixedly applied to the second conduction terminals of the output reset transistor, the node stabilization transistor, and the output initialization transistor.

5. The shift register according to claim 4, wherein the unit circuit further comprises a transistor configured to control a potential of the output terminal to be the on level in accordance with an all-on control signal which becomes the on level when performing an all-on output.

6. The shift register according to claim 5, wherein the node control unit further includes:
- a transistor configured to supply an on potential to the first transistor in accordance with a negative signal of the all-on control signal;
- a transistor having a conduction terminal connected to the second node, a conduction terminal connected to a third node, and a control terminal to which the negative signal of the all-on control signal is supplied; and
- a transistor configured to control the potential of the second node to be the off level in accordance with the all-on control signal, and
- a control terminal of the second transistor, a second conduction terminal of the fourth transistor, and a second conduction terminal of the fifth transistor are connected to the third node.

7. The shift register according to claim 5, wherein the node control unit further includes:
- a transistor configured to control the potential of the first node to be the off level in accordance with the all-on control signal; and
- a transistor configured to control the potential of the second node to be the off level in accordance with the all-on control signal, and
- the first transistor is configured to supply a negative signal of the all-on control signal to the first node in accordance with the input signal.

8. The shift register according to claim 3, wherein an all-on control signal which becomes the on level when performing an all-on output is supplied to the second conduction terminals of the output reset transistor, the node stabilization transistor, and the output initialization transistor.

9. The shift register according to claim 2, wherein the node control unit further includes a transistor having a conduction terminal connected to the first node, a conduction terminal connected to one conduction terminals of the first and second transistors, and a control terminal to which an on potential is fixedly applied.

10. The shift register according to claim 2, wherein one conduction terminals of the first and second transistors are connected to the first node.

11. The shift register according to claim 1, further comprising a plurality of selection circuits configured to select one of an output signal of the unit circuit in a previous stage and an output signal of the unit circuit in a next stage, as an input signal of the unit circuit.

12. The shift register according to claim 1, wherein the unit circuit comprises a plurality of the output transistors, a plurality of the output reset transistors, a plurality of the node stabilization transistors, and a plurality of the output initialization transistors.

13. A display device comprising:
- a plurality of scanning lines arranged in parallel to each other;
- a plurality of data lines arranged in parallel to each other so as to intersect with the scanning lines perpendicularly;
- a plurality of pixel circuits arranged corresponding to intersections of the scanning lines and the data lines; and
- a shift register according to claim 1 as a scanning line drive circuit configured to drive the scanning lines.

* * * * *